(12) United States Patent
Ikeda

(10) Patent No.: US 10,389,111 B2
(45) Date of Patent: Aug. 20, 2019

(54) ELECTROSTATIC PROTECTION CIRCUIT, SEMICONDUCTOR INTEGRATED CIRCUIT DEVICE, AND ELECTRONIC DEVICE

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 271 days.

(21) Appl. No.: 15/420,979

(22) Filed: Jan. 31, 2017

(65) Prior Publication Data
US 2017/0244244 A1 Aug. 24, 2017

(30) Foreign Application Priority Data
Feb. 23, 2016 (JP) .................................. 2016-031697

(51) Int. Cl.
*H02H 9/04* (2006.01)
*H01L 27/02* (2006.01)
*H01L 27/06* (2006.01)
*H01L 29/744* (2006.01)
(Continued)

(52) U.S. Cl.
CPC ......... *H02H 9/046* (2013.01); *H01L 27/0255* (2013.01); *H01L 27/0259* (2013.01); *H01L 27/0262* (2013.01); *H01L 27/0288* (2013.01); *H01L 27/0635* (2013.01);
(Continued)

(58) Field of Classification Search
CPC .............................. H02H 9/046; H01L 27/0255
See application file for complete search history.

(56) References Cited

U.S. PATENT DOCUMENTS

| 5,982,601 A | * | 11/1999 | Lin | ..................... H01L 27/0262 |
| | | | | 361/111 |
| 6,501,632 B1 | * | 12/2002 | Avery | ................. H01L 27/0277 |
| | | | | 327/313 |
| 2002/0030231 A1 | | 3/2002 | Okawa et al. | |

(Continued)

FOREIGN PATENT DOCUMENTS

JP  2001-345421 A  12/2001
JP  2014-120547 A   6/2014
(Continued)

*Primary Examiner* — Scott Bauer
(74) *Attorney, Agent, or Firm* — Oliff PLC

(57) ABSTRACT

This electrostatic protection circuit enables a high hold voltage to be set, and acts to accurately prevent breakdown of a protected circuit immediately after power on, and to prevent breakdown or deterioration of a protection device during prolonged normal operation, without connecting a resistance element in parallel to a plurality of circuit blocks connected in series. This electrostatic protection circuit is provided with a plurality of circuit blocks connected in series between a first node and a second node, at least one circuit block out of the plurality of circuit blocks including a thyristor having an anode connected to one end of the at least one circuit block and a cathode connected to the other end of the at least one circuit block. When the potential of the first node is higher than the potential of the second node during normal operation, the voltage between both ends of the other circuit blocks out of the plurality of circuit blocks is smaller than the voltage between the anode and the cathode of the thyristor.

13 Claims, 28 Drawing Sheets

(51) Int. Cl.
  *H01L 29/45* (2006.01)
  *H01L 29/866* (2006.01)
(52) U.S. Cl.
  CPC .......... *H01L 27/0647* (2013.01); *H01L 29/45* (2013.01); *H01L 29/744* (2013.01); *H01L 29/866* (2013.01)

(56) References Cited

U.S. PATENT DOCUMENTS

| | | | |
|---|---|---|---|
| 2005/0057866 A1* | 3/2005 | Mergens | ............ H01L 27/0262 361/56 |
| 2011/0304944 A1* | 12/2011 | Salcedo | ................. H01L 23/60 361/111 |
| 2014/0192445 A1 | 7/2014 | Ikeda | |
| 2014/0312378 A1* | 10/2014 | Hsue | ...................... H01L 27/15 257/99 |
| 2015/0162745 A1 | 6/2015 | Ikeda | |
| 2015/0162746 A1 | 6/2015 | Ikeda | |
| 2016/0149403 A1 | 5/2016 | Ikeda | |

FOREIGN PATENT DOCUMENTS

| | | |
|---|---|---|
| JP | 2014-132717 A | 7/2014 |
| JP | 2015-115338 A | 6/2015 |
| JP | 2015-115339 A | 6/2015 |
| JP | 2016-100525 A | 5/2016 |

\* cited by examiner

| LEVEL | CONTACT DISCHARGE | AERIAL DISCHARGE |
|---|---|---|
| 1 | 2kV | 2kV |
| 2 | 4kV | 4kV |
| 3 | 6kV | 8kV |
| 4 | 8kV | 15kV |
| X | special | special |

| LEVEL | INDICATED VOLTAGE | Ip(±15%) | tr(±25%) | I₃₀(±30%) | I₆₀(±30%) |
|---|---|---|---|---|---|
| 1 | 2kV | 7.5A | 0.8ns | 4A | 2A |
| 2 | 4kV | 15A | 0.8ns | 8A | 4A |
| 3 | 6kV | 22.5A | 0.8ns | 12A | 6A |
| 4 | 8kV | 30A | 0.8ns | 16A | 8A |

ELECTROSTATIC PROTECTION CIRCUIT, SEMICONDUCTOR INTEGRATED CIRCUIT DEVICE, AND ELECTRONIC DEVICE

BACKGROUND

1. Technical Field

The present invention relates to an electrostatic protection circuit that protects an internal circuit of a semiconductor integrated circuit device from ESD (electrostatic discharge). Furthermore, the invention relates to a semiconductor integrated circuit device that incorporates such an electrostatic protection circuit, and to an electronic device or the like that uses such a semiconductor integrated circuit device.

2. Related Art

Provision of an electrostatic protection circuit in a semiconductor integrated circuit device is carried out in order to prevent breakdown of an internal circuit due to static electricity charged on a person's body, a conveyance device or the like being applied to the internal circuit. For example, the electrostatic protection circuit is connected between a first terminal to which a power supply potential on a high potential side is supplied and a second terminal to which a power supply potential on a low potential side is supplied.

A positive charge is released to the second terminal via the electrostatic protection circuit when a positive charge is applied to the first terminal by electrostatic discharge or the like, thus enabling breakdown of the internal circuit to be prevented since an excessive voltage is not applied to the internal circuit. On the other hand, in order to avoid malfunction during normal operation, a trigger voltage and a hold voltage of the electrostatic protection circuit are desirably set higher than a power supply voltage.

As a related technology, an ESD protection circuit that is provided with a first clamp circuit and a second clamp circuit serially connected between a first power supply terminal and a second power supply terminal is disclosed in FIGS. 1 and 2 of JP-A-2014-120547. The first clamp circuit has a first protection transistor in which the drain is connected to a first high potential side node and the source and the gate are connected to a first low potential side node.

The second clamp circuit has a resistance element connected at one end to a second high potential side node, a capacitance element provided between a second low potential side node and the other end of the resistance element, an inverter that outputs a control signal of a logical value that depends on a potential of the connection point of the resistance element and the capacitance element, and a second protection transistor in which the drain is connected to the second high potential side node, the source is connected to the second low potential side node, and the control signal is supplied to the gate and the back gate.

Here, the resistance element, the capacitance element and the like that decide the response time of the second clamp circuit are also referred to as an RC timer. Although a high hold voltage can also be set by serially connecting the two clamp circuits having an RC timer, there is a risk of the trigger voltage falling below the power supply voltage due to the action of the RC timer, causing discharge current to flow during normal operation. According to the ESD protection circuit shown in FIGS. 1 and 2 of JP-A-2014-120547, the two clamp circuits are serially connected between the first power supply terminal and the second power supply terminal, making it possible to set a high hold voltage and to suppress an increase in discharge current during normal operation.

In the case where, however, the source-drain voltage of the first protection transistor shows a different value to the source-drain voltage of the second protection transistor immediately after power on, there is a risk of not being able to accuracy prevent breakdown of a protected circuit. Furthermore, a higher voltage than the voltage that is applied between the source and the drain of the first protection transistor is applied between the source and the drain of the second protection transistor, thus causing breakdown or deterioration of the second protection transistor to readily occur, due to prolonged normal operation.

In view of this, respectively connecting the first resistance element and the second resistance element that have the same resistance value in parallel to the first clamp circuit and the second clamp circuit has also been proposed, as shown in FIG. 9 of JP-A-2014-120547. The current that flows to the first resistance element is sufficiently larger than the leakage current that flows to the first clamp circuit, and the current that flows to the second resistance element is sufficiently larger than the leakage current that flows to the second clamp circuit. The source-drain voltage of the first protection transistor and the source-drain voltage of the second protection transistor are thereby equalized, enabling breakdown of a protected circuit to be accurately prevented, and breakdown or deterioration of the second protection transistor to be prevented.

JP-A-2014-120547 is an example of related art (see paras. 0005 to 0006, 0082 to 0086, FIGS. 1, 2 and 9).

As shown in FIG. 9 of JP-A-2014-120547, in the case of connecting the first resistance element and the second resistance element respectively in parallel to the first clamp circuit and the second clamp circuit in the ESD protection circuit, an increase in circuit area (chip size) will result. Also, in the case where a configuration is adopted in which the discharge operation starts immediately upon the voltage that is applied between the power supply terminals rising steeply, there is a possibility that all of the surge current produced by ESD immunity testing will flow into the electrostatic protection circuit incorporated in the semiconductor integrated circuit device.

SUMMARY

An advantage of some aspects of the invention is to accurately prevent breakdown of a protected circuit immediately after power on and to prevent breakdown or deterioration of a protection device during prolonged normal operation, without connecting a resistance element in parallel to a plurality of circuit blocks connected in series, in an electrostatic protection circuit that enables a high hold voltage to be set.

Another advantage of some aspects of the invention is to prevent all of the surge current produced by ESD immunity testing from flowing into the electrostatic protection circuit, while effectively protecting an internal circuit of a semiconductor integrated circuit device from ESD. A further advantage of some aspects of the invention is to provide a semiconductor integrated circuit device that incorporates such an electrostatic protection circuit, and an electronic device or the like that uses such a semiconductor integrated circuit device.

An electrostatic protection circuit according to a first aspect of the invention is connected to a first terminal via a first node and connected to a second terminal via a second node, and includes a plurality of circuit blocks connected in series between the first node and the second node. At least one circuit block out of the plurality of circuit blocks includes a thyristor having an anode connected to one end of the at least one circuit block and a cathode connected to another end of the at least one circuit block, and when a potential of the first node is higher than a potential of the second node during normal operation, a voltage between both ends of the other circuit blocks out of the plurality of circuit blocks is smaller than a voltage between the anode and the cathode of the thyristor.

According to the first aspect of the invention, a plurality of circuit blocks are connected in series, thus enabling a high hold voltage to be set. Also, because at least one circuit block includes a thyristor having a small leakage current, and a device having a comparatively large current relative to the applied voltage or such a connection is used in the other circuit blocks, such that the voltage between both ends of the other circuit blocks is smaller than the voltage between the anode and the cathode of the thyristor during normal operation, the ratio of the voltages that are applied to the plurality of circuit blocks during normal operation is decided by the current that flows to the circuit blocks.

It is thereby possible to accurately prevent breakdown of the protected circuit immediately after power on, and to prevent breakdown or deterioration of the protection device during prolonged normal operation, without connecting a resistance element in parallel to the plurality of circuit blocks. As a result, a resistance element for voltage division is no longer required, in comparison with the related technology shown in FIG. 9 of JP-A-2014-120547, thus enabling circuit area (chip size) to be reduced. Also, given that the leakage current of the thyristor is small, overvoltage is not readily applied to the other circuit blocks during normal operation, enabling a wider selection of devices constituting the other circuit blocks.

Here, a configuration may be adopted in which another at least one circuit block out of the plurality of circuit blocks includes a bipolar transistor having a collector connected to one end of the other at least one circuit block and an emitter connected to another end of the other at least one circuit block, a resistance element connected between the emitter and a base of the bipolar transistor, and a zener diode that is connected between the collector and the base of the bipolar transistor and that allows current to flow to the resistance element or to the base of the bipolar transistor when the potential of the first node becomes higher than the potential of the second node and the voltage between both ends of the other at least one circuit block reaches a breakdown voltage.

The relation between the trigger voltage and the hold voltage in the other at least one circuit block can thus be adjusted, by adopting a configuration that controls the current that flows to the base of the bipolar transistor using a zener diode and a resistance element.

Alternatively, a configuration may be adopted in which another at least one circuit block out of the plurality of circuit blocks includes a MOS transistor that has a drain connected to one end of the other at least one circuit block and a source connected to another end of the other at least one circuit block, and that allows discharge current to flow when the potential of the first node becomes higher than the potential of the second node and the voltage between both ends of the other at least one circuit block reaches a predetermined voltage.

For example, in the case of using a MOS transistor having a low breakdown voltage and in which the gate is connected to the source, the trigger voltage and the hold voltage of the other at least one circuit block are characterized in being relatively low. Accordingly, by using such a MOS transistor, the hold voltage of the electrostatic protection circuit can be finely set according to the specification of the power supply voltage.

Alternatively, a configuration may be adopted in which another at least one circuit block out of the plurality of circuit blocks includes a bipolar transistor that has a collector connected to one end of the other at least one circuit block and an emitter connected to another end of the other at least one circuit block, and that allows discharge current to flow when the potential of the first node becomes higher than the potential of the second node and the voltage between both ends of the other at least one circuit block reaches a predetermined voltage.

For example, in the case of using a bipolar transistor having a low breakdown voltage and in which the base is connected to the emitter via a resistance element, the trigger voltage and the hold voltage of the other at least one circuit block are characterized in being relatively low. Accordingly, by using such a bipolar transistor, the hold voltage of the electrostatic protection circuit can be finely set according to the specification of the power supply voltage.

In that case, a configuration may be adopted in which a predetermined region, of the drain or the source of the MOS transistor or of the collector of the bipolar transistor, including a portion that a contact contacts is silicided, and a remaining region of the drain or the source or of the collector is not silicided. The breakdown current of the electrostatic protection circuit can thereby be increased, improving the electrostatic breakdown strength.

In the above, a configuration may be adopted in which the electrostatic protection circuit further includes a diode or a transistor that has one end connected to a P-gate of the thyristor and another end connected to an N-gate of the thyristor, and that allows current to flow to the circuit block including the thyristor when the potential of the first node becomes higher than the potential of the second node and the voltage between both ends of the circuit block including the thyristor reaches a breakdown voltage. The trigger voltage of the electrostatic protection circuit can be set, using a diode or a transistor connected in such a manner.

Alternatively, a configuration may be adopted in which the electrostatic protection circuit further includes (i) an overvoltage detection circuit that includes a diode or a transistor, and that detects an overvoltage that is applied between the first node and the second node and generates a detection signal, and (ii) a delay circuit that at least delays the detection signal that is generated by the overvoltage detection circuit and supplies the delayed detection signal to a gate of the thyristor. It is thereby possible to prevent all of the surge current produced by ESD immunity testing from flowing into the electrostatic protection circuit, while effectively protecting the internal circuit of the semiconductor integrated circuit device from ESD. As a result, miniaturization of the electrostatic protection circuit becomes possible.

A semiconductor integrated circuit device according to a second aspect of the invention is provided with any of the above electrostatic protection circuits. According to the second aspect of the invention, it is possible to provide a semiconductor integrated circuit device having a high breakdown voltage and with which an increase in chip size is suppressed, by incorporating an electrostatic protection circuit that enables a high hold voltage to be set and can be miniaturized.

An electronic device according to a third aspect of the invention is provided with the above semiconductor integrated circuit device. According to the third aspect of the invention, a highly reliable electronic device can be provided at low cost, using a semiconductor integrated circuit device having a high breakdown voltage and with which an increase in chip size is suppressed.

Here, a configuration may be adopted in which the electronic device further includes a zener diode that is mounted on a circuit board together with the semiconductor integrated circuit device, and that has a cathode connected to the first terminal and an anode connected to the second terminal. By providing a zener diode on the circuit board, surge current that is produced by ESD immunity testing flows though the zener diode. Accordingly, the current that flows to the electrostatic protection circuit incorporated in the semiconductor integrated circuit device decreases, thus enabling further miniaturization of the electrostatic protection circuit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
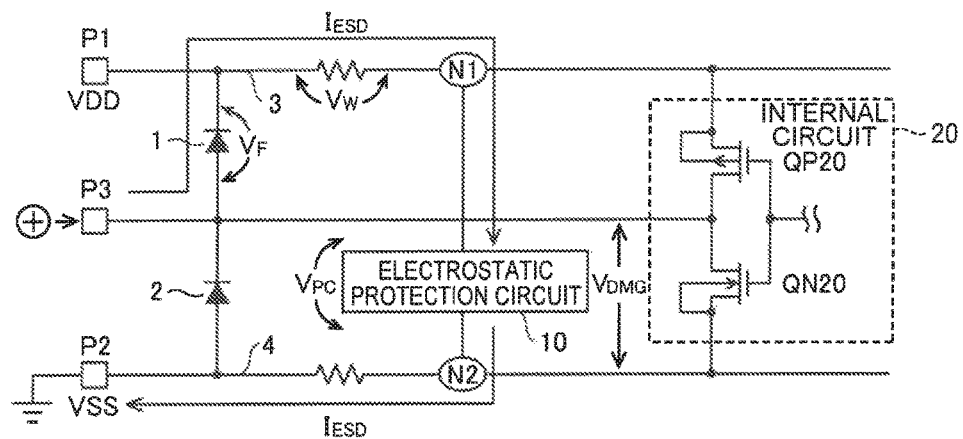
FIG. 1 is a circuit diagram showing an exemplary configuration of a semiconductor integrated circuit device according to one embodiment of the invention.

Hereinafter, embodiments of the invention will be described in detail, with reference to the drawings. Note that like reference numerals are given to like constituent elements, and redundant description will be omitted.

Figure 2:
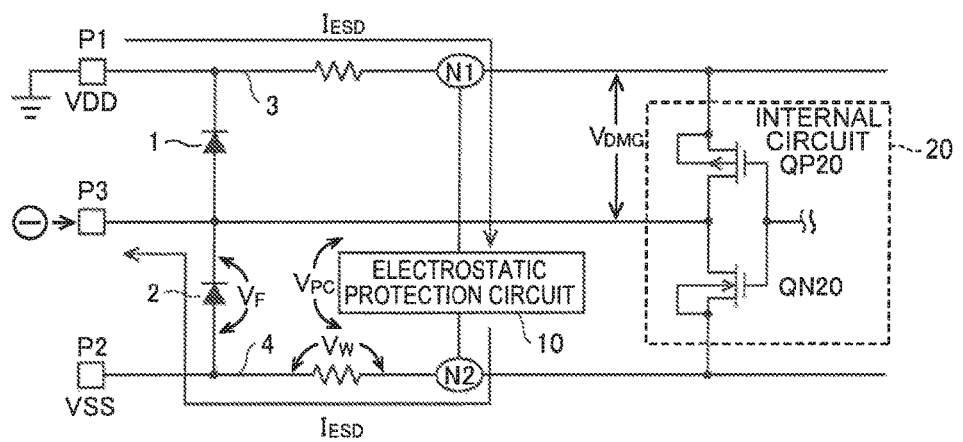
FIG. 2 is a circuit diagram showing an exemplary configuration of a semiconductor integrated circuit device according to one embodiment of the invention.

FIGS. 1 and 2 are circuit diagrams showing an exemplary configuration of a semiconductor integrated circuit device according to one embodiment of the invention. This semiconductor integrated circuit device includes power supply terminals P1 and P2, a signal terminal P3, diodes 1 and 2, power supply interconnects 3 and 4, an electrostatic protection circuit 10 according to any of the embodiments of the invention, and an internal circuit 20. The power supply interconnects 3 and 4 each have a resistance component. Also, the internal circuit 20 includes a P-channel MOS transistor QP20 and an N-channel MOS transistor QN20.

In FIGS. 1 and 2, the signal terminal P3 is connected to an output side of the internal circuit 20 (drains of the transistors QP20 and QN20), but the signal terminal P3 may be connected to an input side of the internal circuit 20 (gates of the transistors QP20 and QN20). In any case, the operating specifications of the electrostatic protection circuit 10 are mainly decided by the gate breakdown voltage of the transistors of the internal circuit 20.

For example, the electrostatic protection circuit 10 may be connected between the power supply terminal P1 to which a power supply potential VDD on the high potential side is supplied and the power supply terminal P2 to which a power supply potential VSS on the low potential side is supplied. Also, the electrostatic protection circuit 10 may be connected between the power supply terminal P1 and the signal terminal P3, or may be connected between the signal terminal P3 and the power supply terminal P2. In the following embodiments, the case where the electrostatic protection circuit 10 is connected to the power supply terminal P1 via a node N1 and is connected to the power supply terminal P2 via a node N2, as shown in FIGS. 1 and 2, will be described as an example.

When a positive charge is applied to the power supply terminal P2 by electrostatic discharge or the like, a positive charge is released to the signal terminal P3 via the diode 2 or is released to the power supply terminal P1 via the diodes 2 and 1, thus enabling breakdown of the internal circuit 20 to be prevented, since an excessive voltage is not applied to the internal circuit 20. Accordingly, a problem arises in the case where a reverse voltage is applied to at least one of the diodes 1 and 2.

The discharge path in the case where a positive charge is applied to the signal terminal P3 by electrostatic discharge or the like while the power supply terminal P2 is grounded is shown in FIG. 1. Due to the electrostatic discharge or the like, a surge current $I_{ESD}$ flows on a path through the diode 1, the power supply interconnect 3, the electrostatic protection circuit 10 and the power supply interconnect 4.

In the discharge operation, the electrostatic protection circuit 10 is able to protect the internal circuit 20, if the drain-source voltage of the transistor QN20 connected in parallel to the diode 2 to which the reverse voltage is applied is smaller than a breakdown voltage $V_{DMG}$ that leads to breakdown of the transistor QN20. To achieve this, the following equation (1) needs to be satisfied.

$$V_F+V_W+V_{PC}<V_{DMG} \quad (1)$$

Here, $V_F$ is the forward voltage of the diode 1, $V_W$ is the voltage that is produced when the surge current $I_{ESD}$ flows to the resistance component of the power supply interconnect 3, and $V_{PC}$ is the voltage that is produced when the surge current $I_{ESD}$ flows to the electrostatic protection circuit 10.

Also, the discharge path in the case where a negative charge is applied to the signal terminal P3 by electrostatic discharge or the like while the power supply terminal P1 is grounded is shown in FIG. 2. Due to the electrostatic discharge or the like, the surge current $I_{ESD}$ flows in a path through the power supply interconnect 3, the electrostatic protection circuit 10, the power supply interconnect 4 and the diode 2.

In the discharge operation, the electrostatic protection circuit 10 is able to protect the internal circuit 20, if the source-drain voltage of the transistor QP20 connected in parallel to the diode 1 to which the reverse voltage is applied is smaller than the breakdown voltage $V_{DMG}$ that leads to breakdown of the transistor QP20. To achieve this, the following equation (2) needs to be satisfied.

$$V_F+V_W+V_{PC}<V_{DMG} \quad (2)$$

Here, $V_F$ is the forward voltage of the diode 2, $V_W$ is the voltage that is produced when the surge current $I_{ESD}$ flows to the resistance component of the power supply interconnect 4, and $V_{PC}$ is the voltage that is produced when the surge current $I_{ESD}$ flows to the electrostatic protection circuit 10.

As is evident from equations (1) and (2), in the case shown in FIGS. 1 and 2, the condition for protecting the internal circuit 20 can be represented with the same equation. That is, the sum of the voltages that are produced in devices on the discharge path being smaller than the breakdown voltage $V_{DMG}$ that leads to breakdown of elements of the internal circuit 20 serves as a condition for protecting the internal circuit 20. Providing such an electrostatic protection circuit 10 enables breakdown of the internal circuit 20 due to electrostatic discharge or the like to be prevented in various types of semiconductor integrated circuit devices.

First Embodiment

Figure 3:
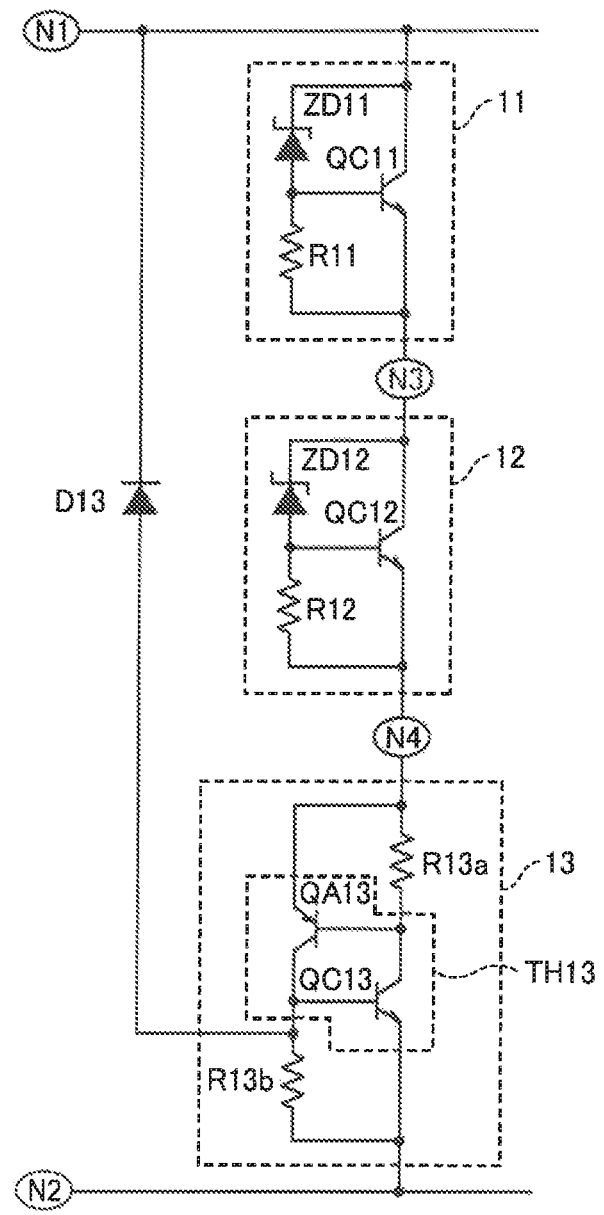
FIG. 3 is a circuit diagram showing an exemplary configuration of an electrostatic protection circuit according to a first embodiment of the invention.

FIG. 3 is a circuit diagram showing an exemplary configuration of the electrostatic protection circuit according to a first embodiment of the invention. As shown in FIG. 3, the electrostatic protection circuit according to the first embodiment includes a plurality of circuit blocks (e.g., discharge circuits or clamp circuits) connected in series between a node N1 and a node N2. Connecting a plurality of circuit blocks in series enables a high hold voltage to be set.

At least one circuit block out of the plurality of circuit blocks includes a thyristor. Also, when the potential of the node N1 is higher than the potential of the node N2 during normal operation, the voltage between both ends of the other circuit blocks that do not include the thyristor out of the plurality of circuit blocks is smaller than the voltage between the anode and the cathode of the thyristor.

Three circuit blocks 11 to 13 connected in series between a node N1 and a node N2 are shown as an example in FIG. 3. Here, the circuit block 13 includes the thyristor, and the circuit block 11 and the circuit block 12 correspond to the other circuit blocks that do not include a thyristor. The configuration shown in FIG. 3 is one example, and the number and connection order of the circuit blocks are arbitrary. For example, the circuit blocks may be connected in order of the circuit block 11, the circuit block 13 and the circuit block 12 from the node N1.

The circuit block 11 includes an NPN bipolar transistor QC11, a resistance element R11, and a zener diode ZD11. The transistor QC11 has a collector connected to one end (node N1) of the circuit block 11, and an emitter connected to the other end (node N3) of the circuit block 11.

The resistance element R11 is connected between the base and the emitter of the transistor QC11. The zener diode ZD11 is connected between the collector and the base of the transistor QC11, and has a cathode connected to the collector of the transistor QC11 and an anode connected to the base of the transistor QC11.

The zener diode ZD11 allows current to flow to the resistance element R11 or to the base of the transistor QC11 when the potential of the node N1 becomes higher than the potential of the node N2 and the voltage between both ends of the circuit block 11 reaches the breakdown voltage (trigger voltage of the circuit block 11). That is, current flows to the resistance element R11, and current also flows to the base of the transistor QC11 when the base-emitter voltage of the transistor QC11 becomes greater than or equal to the threshold voltage. Because the transistor QC11 enters an ON state when current flows to the base of the transistor QC11, allowing current to flow from the node N1 to the node N3, the voltage between the node N1 and the node N3 is clamped. In this application, a configuration such as the circuit block 11 is referred to as a zener trigger bipolar transistor.

Similarly, the circuit block 12 includes an NPN bipolar transistor QC12, a resistance element R12, and a zener diode ZD12. The transistor QC12 has a collector connected to one end (node N3) of the circuit block 12 and an emitter connected to the other end (node N4) of the circuit block 12.

The resistance element R12 is connected between the base and the emitter of the transistor QC12. The zener diode ZD12 is connected between the collector and the base of the transistor QC12, and has a cathode connected to the collector of the transistor QC12 and an anode connected to the base of the transistor QC12.

The zener diode ZD12 allows current to flow to the resistance element R12 or to the base of the transistor QC12 when the potential of the node N1 becomes higher than the potential of the node N2 and the voltage between both ends of the circuit block 12 reaches the breakdown voltage (trigger voltage of the circuit block 12). That is, current flows to the resistance element R12, and current also flows to the base of the transistor QC12 when the base-emitter voltage of the transistor QC12 becomes greater than or equal to the threshold voltage. Because the transistor QC12 enters an ON state when current flows to the base of the transistor QC12, allowing current to flow from the node N3 to the node N4, the voltage between the node N3 and the node N4 is clamped.

The relation between the trigger voltage and the hold voltage in the circuit block 11 or 12 can thus be adjusted, by adopting a configuration in which the current that flows to the base of the bipolar transistor QC11 or QC12 is controlled by the zener diode ZD11 or ZD12 and the resistance element R11 or R12.

The circuit block 13 includes a thyristor TH13 and resistance elements R13a and R13b. The thyristor TH13 is constituted by a PNP bipolar transistor QA13 and an NPN bipolar transistor QC13. Here, the emitter of the transistor QA13 corresponds to the anode of the thyristor TH13, and the emitter of the transistor QC13 corresponds to the cathode of the thyristor TH13. Also, the base of the transistor QA13 corresponds to the N-gate of the thyristor TH13, and the base of the transistor QC13 corresponds to the P-gate of the thyristor TH13.

The emitter of the transistor QA13 is connected to one end (node N4) of the circuit block 13, the collector is connected to the other end (node N2) of the circuit block 13 via the resistance element R13b, and the base is connected to one end (node N4) of the circuit block 13 via the resistance element R13a. Also, the collector of the transistor QC13 is connected to the base of the transistor QA13, the emitter is connected to the other end (node N2) of the circuit block 13, and the base is connected to the collector of the transistor QA13.

Furthermore, a diode D13 is connected between the node N1 and the base of the transistor QC13 (P-gate of the thyristor TH13). The diode D13 has a cathode connected to the node N1 and an anode connected to the base of the transistor QC13. The diode D13 allows current to flow to the circuit block 13 when the potential of the node N1 becomes higher than the potential of the node N2 and the voltage between the cathode and the anode reaches the breakdown voltage. That is, current flows to the resistance element R13b, and current also flows to the base of the transistor QC13 when the base-emitter voltage of the transistor QC13 becomes greater than or equal to the threshold voltage. The trigger voltage of the electrostatic protection circuit can be set by the diode D13 connected in this manner. Note that a zener diode may be used as the diode D13.

The transistor QC13 enters an ON state when current flows to the base of the transistor QC13, allowing current to flow from the node N4 to the node N2. Also, the transistor QA13 enters an ON state when a potential difference occurs between both ends of the resistance element R13a and the emitter-base voltage of the transistor QA13 becomes greater than or equal to the threshold voltage. The voltage between the node N4 and the node N2 is clamped as a result of the above operations.

The transistors QC11 and QC12 may be lateral bipolar transistors, and are assumed to be formed in a P-well provided within a P-type semiconductor substrate (e.g., silicon substrate) such that the power supply potential VSS on the low potential side is supplied to the P-type semiconductor substrate and the node N2. In order to electrically isolate the emitters of the transistors QC11 and QC12 from the node N2 in that case, a triple well structure is used. The triple well structure is, for example, a three-layer structure that is configured by forming an N-type embedded diffusion layer within the P-type semiconductor substrate, and further forming a P-well thereon.

Within the P-well are formed an N-type impurity diffusion region serving as the collector of the NPN bipolar transistor, an N-type impurity diffusion region serving as the emitter of the NPN bipolar transistor, and a P-type impurity diffusion region for providing a potential to the P-well. A zener diode is also formed within the P-well. The resistance element that is connected between the base and the emitter of the NPN bipolar transistor is constituted by the resistance component of the P-well.

Figure 4A:
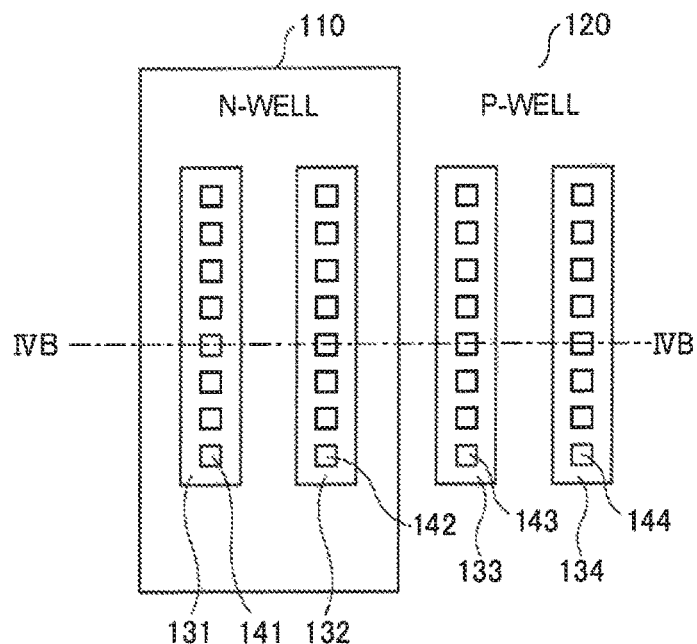
FIGS. 4A and 4B are diagrams showing an exemplary layout of a thyristor shown in FIG. 3.
Figure 4B:
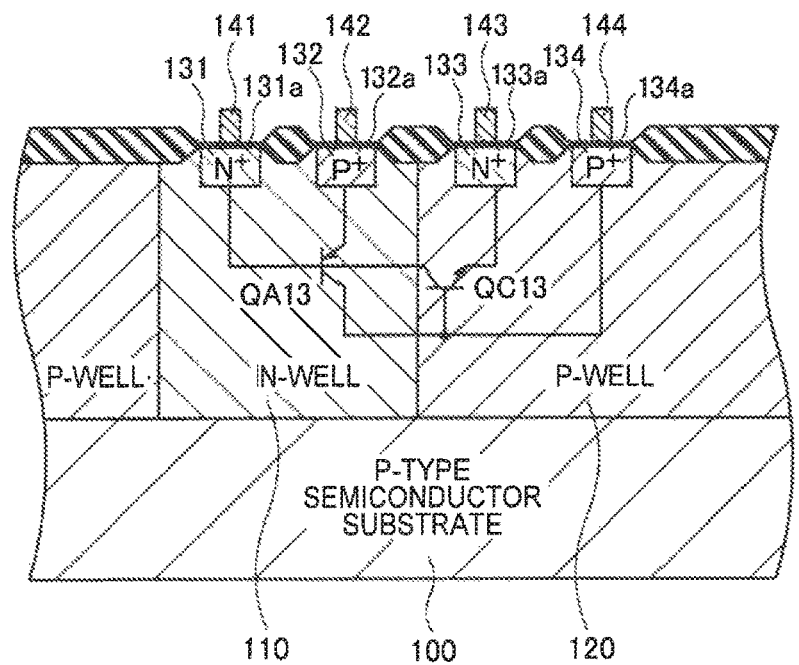

FIGS. 4A and 4B are diagrams showing an exemplary layout of the thyristor shown in FIG. 3. FIG. 4A is a plan view, and FIG. 4B is a cross-sectional view along IVB-IVB shown in FIG. 4A. As shown in FIGS. 4A and 4B, an N-well 110 and a P-well 120 are formed within a P-type semiconductor substrate (e.g., silicon substrate) 100.

An N$^+$ impurity diffusion region 131 and a P$^+$ impurity diffusion region 132 are formed within the N-well 110. The N-well 110 and the N$^+$ impurity diffusion region 131 correspond to the base of the transistor QA13, that is, the N-gate of the thyristor TH13 shown in FIG. 3, and correspond to the collector of the transistor QC13. Also, the P$^+$ impurity diffusion region 132 corresponds to the emitter of the transistor QA13, that is, the anode of the thyristor TH13 shown in FIG. 3.

An N$^+$ impurity diffusion region 133 and a P$^+$ impurity diffusion region 134 are formed within the P-well 120. The P-well 120 and the P$^+$ impurity diffusion region 134 correspond to the base of the transistor QC13, that is, the P-gate of the thyristor TH13 shown in FIG. 3, and correspond to the collector of the transistor QA13. The N$^+$ impurity diffusion region 133 corresponds to the emitter of the transistor QC13, that is, the cathode of the thyristor TH13 shown in FIG. 3.

Contacts 141 to 144 are respectively electrically connected to the impurity diffusion regions 131 to 134. In the impurity diffusion regions 131 to 134, regions 131a to 134a including the portion that the contacts 141 to 144 contact may be silicided.

A PN junction between the bases of the transistors QC13 and QA13 that constitute the thyristor TH13 shown in FIG. 3 is formed by the P-well 120 and the N-well 110, and impurity concentration of these wells is low. Accordingly, the breakdown voltage of the thyristor TH13 is sufficiently higher than the breakdown voltage of the device (protected circuit) that is being used in the internal circuit 20 (FIG. 1 or 2) of the semiconductor integrated circuit device, and the leakage current of the thyristor TH13 is sufficiently smaller than the leakage current of the protected circuit.

Figure 5:
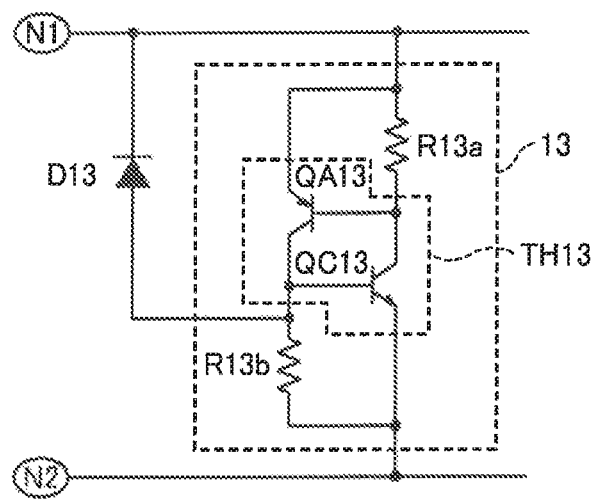
FIG. 5 is a circuit diagram showing the electrostatic protection circuit using the thyristor and a diode shown in FIG. 3.

FIG. 5 is a circuit diagram showing an exemplary configuration of an electrostatic protection circuit using the thyristor and diode shown in FIG. 3. As shown in FIG. 5, the circuit block 13 is connected between the node N1 and the node N2. Also, the cathode of the diode D13 is connected to the node N1. Accordingly, the trigger voltage of the circuit block 13 is set with the breakdown voltage of the diode D13.

Figure 6:
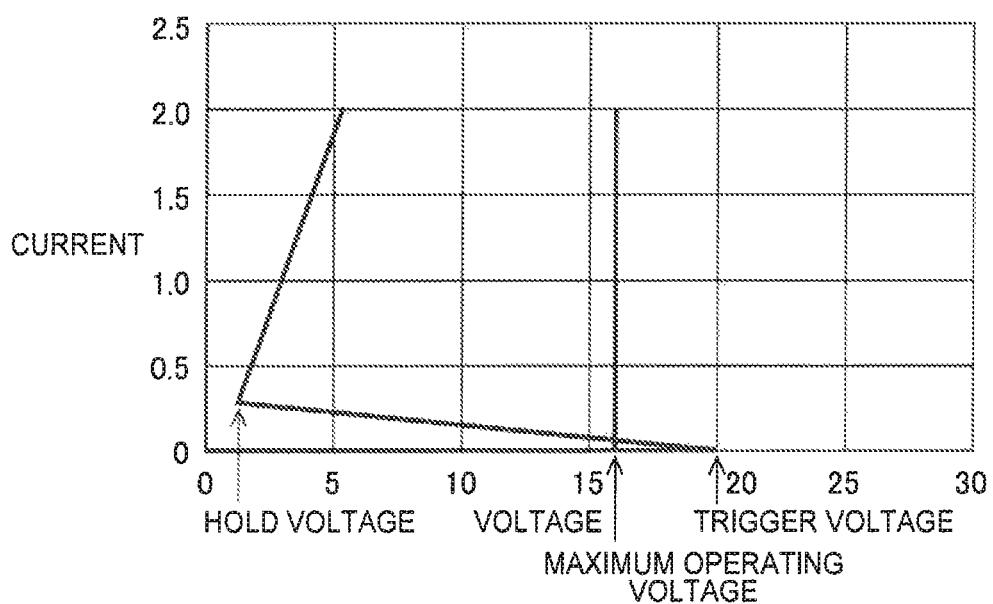
FIG. 6 is a diagram showing exemplary I-V characteristics of the electrostatic protection circuit shown in FIG. 5.

FIG. 6 is a diagram showing exemplary I-V characteristics of the electrostatic protection circuit shown in FIG. 5. In FIG. 6, the horizontal axis represents voltage (V) and the vertical axis represents current (A). When the potential of the node N1 becomes higher than the potential of the node N2 and the voltage between both ends of the circuit block 13 reaches the trigger voltage, the diode D13 enters an ON state, and current is allowed to flow from the node N1 to the node N2. The voltage between the node N1 and the node N2 is thereby clamped. In FIG. 6, the trigger voltage of the circuit block 13 is set to greater than or equal to the maximum operating voltage.

Figure 7:
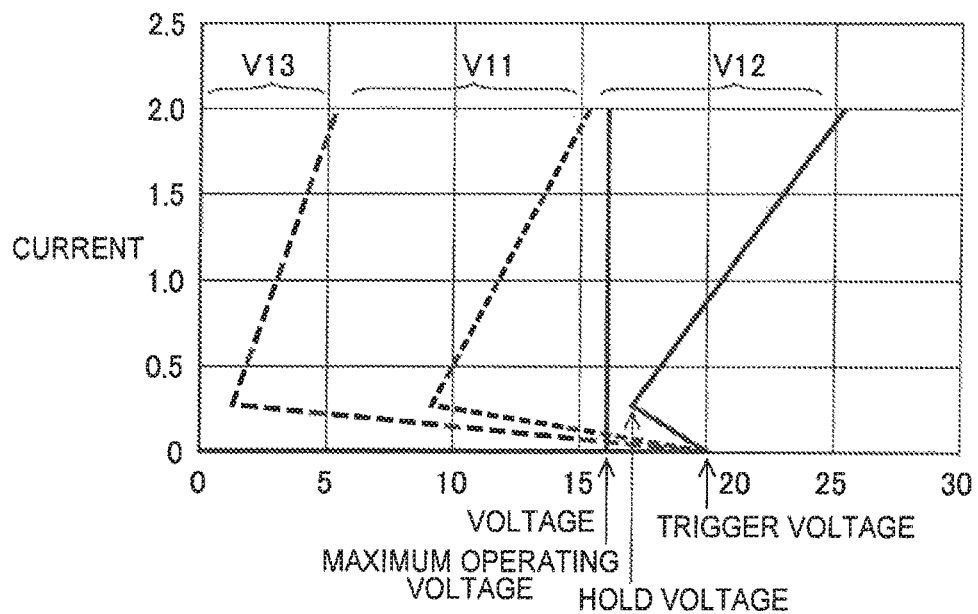
FIG. 7 is a diagram showing exemplary I-V characteristics of the electrostatic protection circuit shown in FIG. 3.

FIG. 7 is a diagram showing exemplary I-V characteristics of the electrostatic protection circuit shown in FIG. 3. In FIG. 7, the horizontal axis represents voltage (V) and the vertical axis represents current (A). As shown in FIG. 7, the voltage between both ends of the electrostatic protection circuit shown in FIG. 3 will be a voltage obtained by adding the voltage V11 between both ends of the circuit block 11 and the voltage V12 between both ends of the circuit block 12 to the voltage V13 between both ends of the circuit block 13. In FIG. 7, the trigger voltage and the hold voltage of the electrostatic protection circuit are set to greater than or equal to the maximum operating voltage. Because the trigger voltage of the electrostatic protection circuit is set by the breakdown voltage of the diode D13, an RC timer having a large circuit area does not need to be provided.

Also, in the PN junction of the zener diodes ZD11 and ZD12 of the circuit blocks 11 and 12, the impurity concentration of both the P-type impurity diffusion region and the N-type impurity diffusion region is high, and thus the leakage current is larger than the thyristor TH13. Accordingly, the leakage current of the zener trigger bipolar transistor of the circuit blocks 11 and 12 is, for example, five or more times the leakage current of the thyristor TH13, and more preferably ten or more times the leakage current of the thyristor TH13.

Hereinafter, the case where the leakage currents of both the circuit blocks 11 and 12 are ten times larger than the leakage current of the circuit block 13 in the case where the same voltage is applied to the circuit blocks 11 to 13 will be described as an example. Note that, in order to simplify the description, leakage current is assumes to be linear with respect to the power supply voltage.

Figure 8:
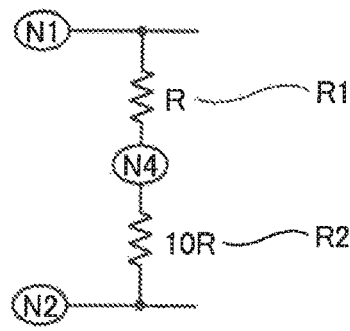
FIG. 8 is a circuit diagram showing an equivalent circuit during normal operation of the electrostatic protection circuit shown in FIG. 3.

FIG. 8 is a circuit diagram showing an equivalent circuit during normal operation of the electrostatic protection circuit shown in FIG. 3. In FIG. 8, a resistor R1 represents the zener trigger bipolar transistors of the circuit blocks 11 and 12 connected in series, and has a resistance value R. Also, a resistor R2 represents the thyristor TH13 or the like of the circuit block 13, and has a resistance value 10R.

Figure 9:
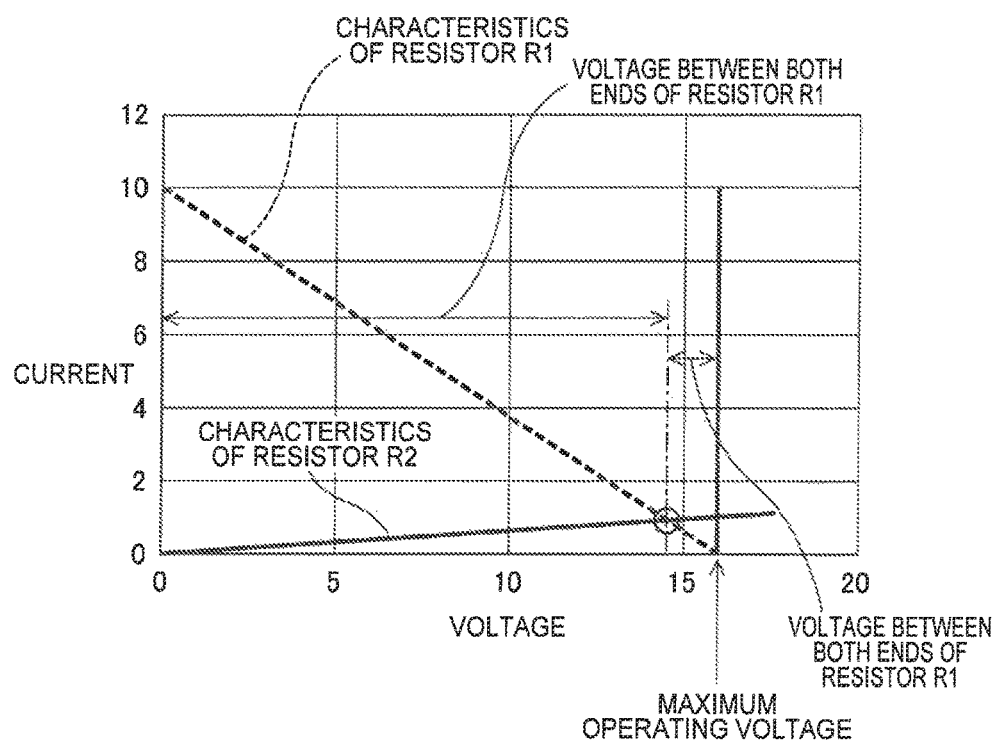
FIG. 9 is a diagram showing exemplary I-V characteristics of the equivalent circuit shown in FIG. 8.

FIG. 9 is a diagram showing exemplary I-V characteristics of the equivalent circuit shown in FIG. 8. In FIG. 9, the horizontal axis represents voltage (V) that is applied to both ends of the resistor R2, and the vertical axis represents leakage current (in arbitrary units) that flows to the resistor R1 or R2. Also, the solid line indicates the characteristics of the resistor R2, and the dashed line indicates the characteristics of the resistor R1. The sum total of the voltages that are applied to the resistors R1 and R2 connected in series is a constant value (maximum operating voltage).

In FIG. 9, the leakage current that flows when a voltage of 16 V is applied between both ends of the resistor R1 is 10, and the leakage current that flows when a voltage of 16 V is applied between both ends of the resistor R2 is 1. The point that is shown with the O mark will be the operating point, under the condition that the current that flows to the resistor R1 and the current that flows to the resistor R2 are equal, because of the resistors R1 and R2 being connected in series.

Here, the voltage that is applied to the resistor R1, that is, the zener trigger bipolar transistor of the circuit blocks 11 and 12 connected in series, will be a voltage less than or equal to 1/10th of the maximum operating voltage, and thus the voltage that is applied between the collector and the emitter of the zener trigger bipolar transistors will be a sufficiently lower voltage than their respective maximum operating voltages. Accordingly, during normal operation, overvoltage is not applied to the zener trigger bipolar transistor, and a deterioration in characteristics or breakdown of the zener trigger bipolar transistor does not result, even when the zener trigger bipolar transistor is not provided with a voltage limiter.

Also, the zener trigger bipolar transistor has a large leakage current in comparison with the thyristor TH13. Accordingly, the ratio of the voltages that are applied to the circuit blocks 11 to 13 during normal operation is decided by the leakage current that flows to the circuit blocks 11 to 13. It is thereby possible to accurately prevent breakdown of the protected circuit immediately after power on, and to prevent breakdown or deterioration of the protection device during prolonged normal operation, without connecting a resistance element in parallel to the circuit blocks 11 to 13.

In the first embodiment, the case where a zener trigger bipolar transistor is used in the circuit blocks 11 and 12 was described, although various devices can be used, apart from a zener trigger bipolar transistor. Also, different devices may be used in the circuit blocks 11 and 12.

Second Embodiment

FIGS. 10A to 10D are circuit diagrams showing exemplary configurations of circuit blocks that are used in the second embodiment of the invention. In the second embodiment, any of circuit blocks 14a to 14d shown in FIGS. 10A to 10D is provided, instead of the circuit block 11 or 12, in the electrostatic protection circuit according to the first embodiment shown in FIG. 3. In other regards, the second embodiment may be configured similarly to the first embodiment.

Figure 10A:
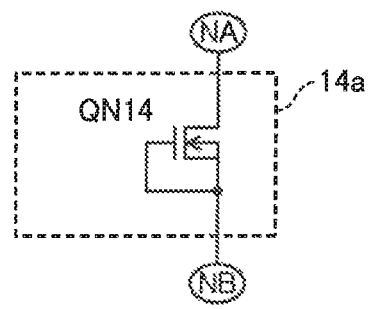
FIGS. 10A to 10D are circuit diagrams showing circuit blocks that are used in a second embodiment of the invention.

As shown in FIG. 10A, the circuit block 14a includes an N-channel MOS transistor QN14 in which the gate is connected to the source. The transistor QN14 has a drain connected to one end (node NA) of the circuit block 14a and a source and a gate connected to the other end (node NB) of the circuit block 14a, and allows discharge current to flow when the potential of the node N1 becomes higher than the potential of the node N2 and the voltage between both ends of the circuit block 14a reaches the breakdown voltage. In order to form the transistor QN14 in the case of electrically isolating the source and the back gate (P-well) of the transistor QN14 from the node N2, a triple well structure is used.

Figure 10B:
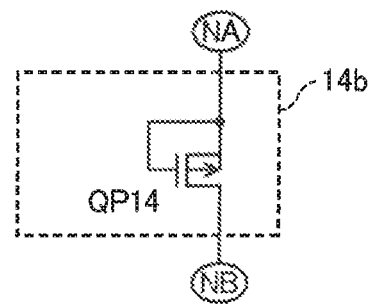

As shown in FIG. 10B, the circuit block 14b includes a P-channel MOS transistor QP14 in which the gate is connected to the source. The transistor QP14 has a source and a gate connected to one end (node NA) of the circuit block 14b and a drain connected to the other end (node NB) of the circuit block 14b, and allows discharge current to flow when the potential of the node N1 becomes higher than the potential of the node N2 and the voltage between both ends of the circuit block 14b reaches the breakdown voltage. In the case of using a P-channel MOS transistor, the P-channel MOS transistor need only be formed in an N-well provided within the P-type semiconductor substrate, thus enabling the P-channel MOS transistor to be formed using a twin well structure, without needing to use a triple well structure.

Figure 10C:
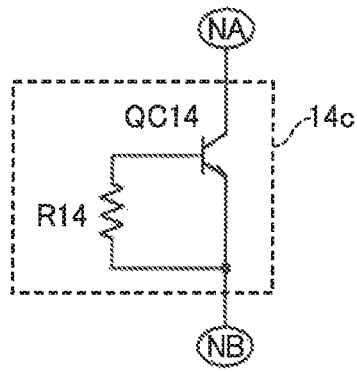

As shown in FIG. 10C, the circuit block 14c includes an NPN bipolar transistor QC14 and a resistance element R14. The transistor QC14 has a collector connected to one end (node NA) of the circuit block 14c and an emitter connected to the other end (node NB) of the circuit block 14c. Also, the resistance element R14 is connected between the base and the emitter of the transistor QC14. The transistor QC14 allows discharge current to flow when the potential of the node N1 becomes higher than the potential of the node N2 and the voltage between both ends of the circuit block 14c reaches the breakdown voltage.

Figure 10D:
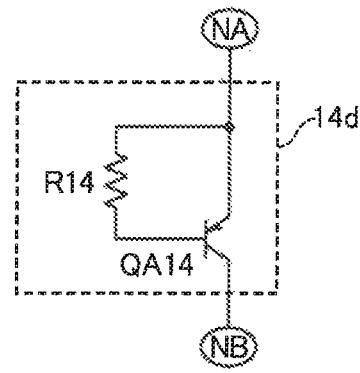

As shown in FIG. 10D, the circuit block 14d includes a PNP bipolar transistor QA14 and a resistance element R14. The transistor QA14 has an emitter connected to one end of the circuit block 14d (node NA) and a collector connected to the other end of the circuit block 14d (node NB). Also, the resistance element R14 is connected between the base and the emitter of the transistor QA14. The transistor QA14 allows discharge current to flow when the potential of the node N1 becomes higher than the potential of the node N2 and the voltage between both ends of circuit block 14d reaches the breakdown voltage.

Figure 11A:
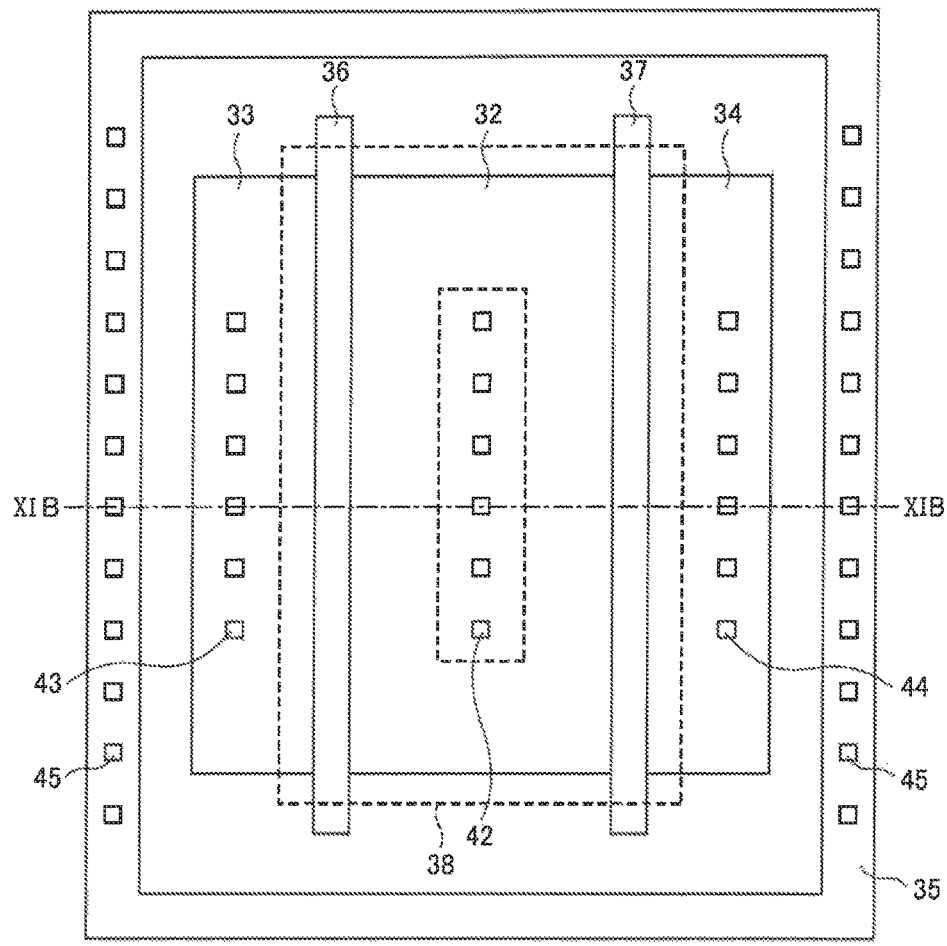
FIGS. 11A and 11B are diagrams showing a first exemplary layout of an N-channel MOS transistor.
Figure 11B:
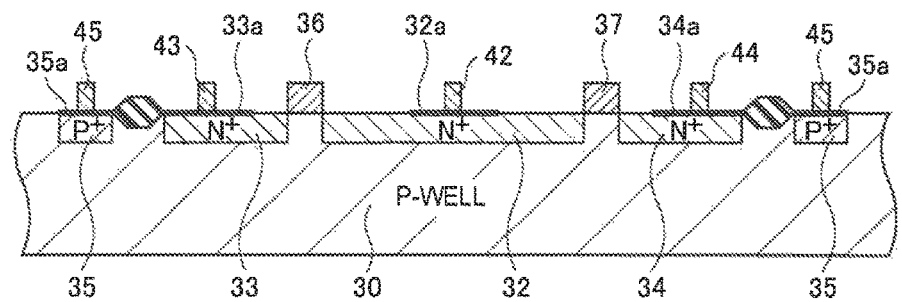

FIGS. 11A and 11B are diagrams showing a first exemplary layout of the N-channel MOS transistor shown in FIG. 10A. FIG. 11A is a plan view, and FIG. 11B is a cross-sectional view along XIB-XIB shown in FIG. 11A.

As shown in FIGS. 11A and 11B, within a P-well 30 are formed an N$^+$ impurity diffusion region 32 serving as the drain of the N-channel MOS transistor, N$^+$ impurity diffusion regions 33 and 34 serving as the source, and a P$^+$ impurity diffusion region 35 for providing a potential to the P-well 30. Also, on the P-well 30 are formed gate electrodes 36 and 37 made of polysilicon or the like, via a gate insulation film (not shown). Although two gate electrodes 36 and 37 are shown in FIGS. 11A and 11B, a configuration may be adopted in which three or more gate electrodes are provided.

Contacts 42 to 45 are respectively electrically connected to the impurity diffusion regions 32 to 35. In the N$^+$ impurity diffusion regions 32 to 34 serving as the drain and the source of the N-channel MOS transistor, predetermined regions 32a to 34a including the portion that the contacts 42 to 44 contact are silicided, and a remaining region 38 thereof is not silicided. Also, in the P$^+$ impurity diffusion region 35, a region 35a including the portion that the contact 45 contacts is silicided.

It is known that, in the case where a silicide layer exists on the impurity diffusion region of a discharge element such as a transistor, breakdown of the discharge element occurs at an extremely low applied voltage. Given that, in exfoliation analysis results, there are signs that current flowed in a notched shape in proximity to the gate electrodes of a MOS transistor in which breakdown has occurred, it is thought that the cause of the breakdown was a local concentration of current produced in that region. The resistance of the impurity diffusion region being lowered due to silicide technology is cited as a reason that local concentrations of current tend to be produced.

For example, in the case where a reverse voltage is applied to an N-channel MOS transistor, electric charge injected from a pad (terminal) is injected into an N$^+$ impurity diffusion region from the contact on the drain, and avalanche breakdown (electron avalanche) is induced at the junction of the N$^+$ impurity diffusion region and the P-well (channel region). Due to the electric charge that flows within the channel region, a potential difference required for the forward current of the diode to flow occurs between the channel potential and the source potential (reference potential), a parasitic bipolar transistor that is formed with a drain, channel and source operates, and discharge is performed in a state where the applied voltage is clamped.

Because the specific resistance of the impurity diffusion regions is large in the case where a silicide layer does not exist on the impurity diffusion regions of the N-channel MOS transistor serving as a discharge element, uniform discharge is performed toward the gate electrodes from the contact on the drain without concentrating at one point, and breakdown of the discharge element thus does not readily occur. In view of this, in this embodiment, a region 38 that has not been silicided is provided in the N$^+$ impurity diffusion regions 32 to 34 serving as the drain and the source of the N-channel MOS transistor, as shown in FIGS. 11A and 11B. The breakdown current of the electrostatic protection circuit can thereby be increased, improving the electrostatic breakdown strength.

Figure 12A:
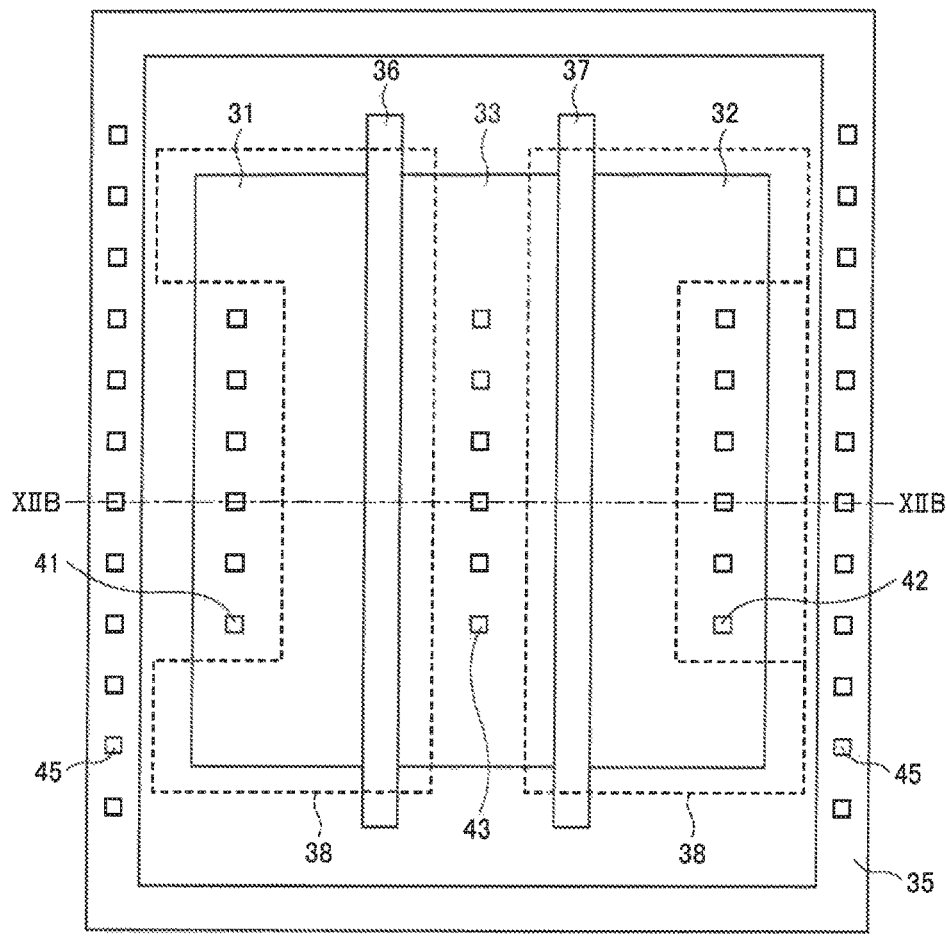
FIGS. 12A and 12B are diagrams showing a second exemplary layout of an N-channel MOS transistor.
Figure 12B:
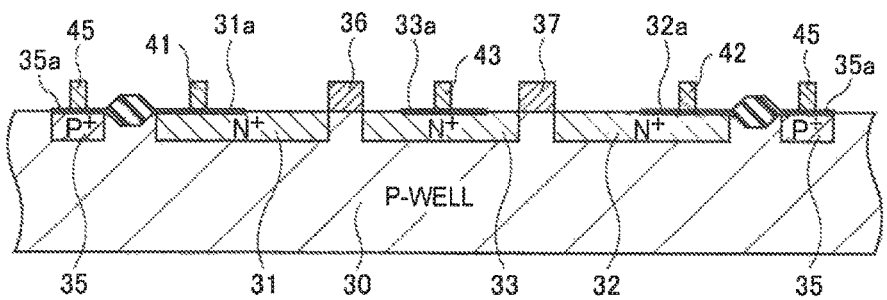

FIGS. 12A and 12B are diagrams showing a second exemplary layout of the N-channel MOS transistor shown in FIG. 10A. FIG. 12A is a plan view, and FIG. 12B is a cross-sectional view along XIIB-XIIB shown in FIG. 12A. In the second exemplary layout, the positions of the drain and the source in the first exemplary layout shown in FIGS. 11A and 11B are reversed.

As shown in FIGS. 12A and 12B, within a P-well 30 are formed N$^+$ impurity diffusion regions 31 and 32 serving as the drain of the N-channel MOS transistor, an N$^+$ impurity diffusion region 33 serving as the source, and a P$^+$ impurity diffusion region 35 for providing a potential to the P-well 30. Also, on the P-well 30 are formed gate electrodes 36 and 37 made of polysilicon or the like, via a gate insulation film (not shown).

Contacts 41 to 43 and 45 are respectively electrically connected to the impurity diffusion regions 31 to 33 and 35. In the N$^+$ impurity diffusion regions 31 to 33 serving as the drain and the source of the N-channel MOS transistor, predetermined regions 31a to 33a including the portion that the contacts 41 to 43 contact are silicided, and a remaining region 38 thereof is not silicided. When the drain is arranged on the outer side, as in the second exemplary layout, the diode that is formed between the P-well and the drain also serves as a discharge path, and acts in the direction in which the on-resistance of the N-channel MOS transistor decreases.

Figure 13A:
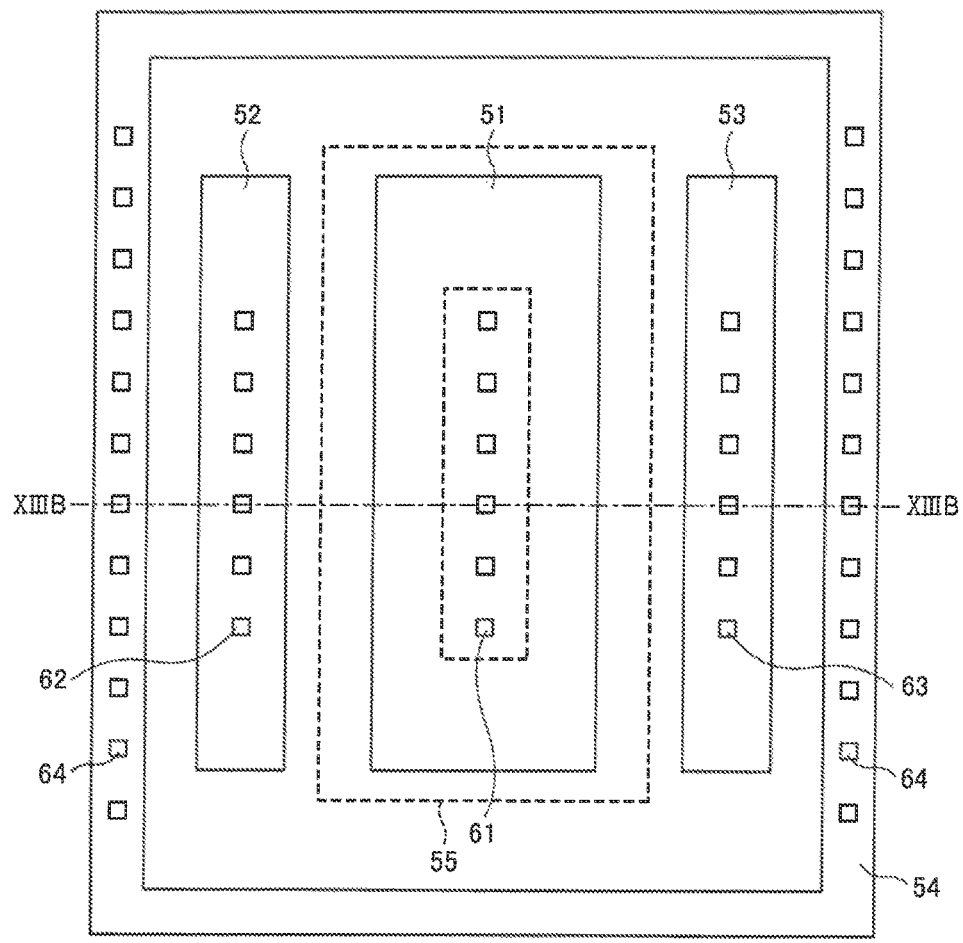
FIGS. 13A and 13B are diagrams showing an exemplary layout of an NPN bipolar transistor.
Figure 13B:
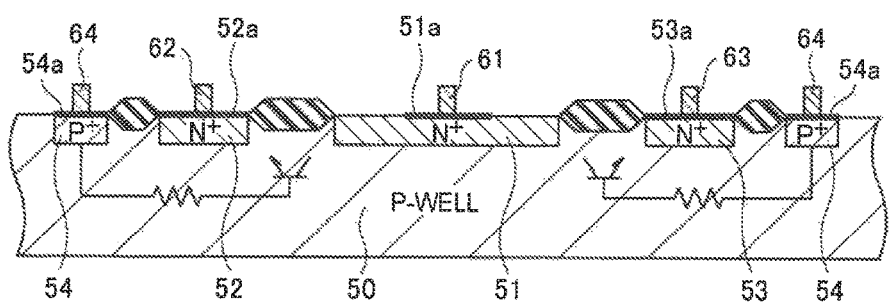

FIGS. 13A and 13B are diagrams showing an exemplary layout of the NPN bipolar transistor shown in FIG. 10C. FIG. 13A is a plan view, and FIG. 13B is a cross-sectional view along XIIIB-XIIIB shown in FIG. 13A.

As shown in FIGS. 13A and 13B, within a P-well 50 serving as the base of an NPN bipolar transistor are formed an N$^+$ impurity diffusion region 51 serving as the collector, N$^+$ impurity diffusion regions 52 and 53 serving as the emitter, and a P$^+$ impurity diffusion region 54 for providing a potential to the P-well 50. Also, a resistance element that is connected between the base and the emitter of the NPN bipolar transistor is constituted by a resistance component of the P-well 50.

Contacts 61 to 64 are respectively electrically connected to the impurity diffusion regions 51 to 54. In the N+ impurity diffusion region 51 serving as the collector of the NPN bipolar transistor, a predetermined region 51a including the portion that the contact 61 contacts is silicided, and a remaining region 55 thereof is not silicided.

Also, in the N+ impurity diffusion regions 52 and 53 serving as the emitter of the NPN bipolar transistor, regions 52a and 53a including the portion that the contacts 62 and 63 contact are silicided, and, in the P+ impurity diffusion region 54, a region 54a including the portion that the contact 64 contacts is silicided.

Because the resistance values of the impurity diffusion regions of the NPN bipolar transistor serving as a discharge element are large in the case where a silicide layer does not exist on the impurity diffusion regions, uniform discharge is performed toward the emitter from the contact on the collector without concentrating at one point, and breakdown of the discharge element thus does not readily occur.

In view of this, in this embodiment, a region 55 that has not been silicided is provided in the N+ impurity diffusion region 51 serving as the collector of the NPN bipolar transistor, as shown in FIGS. 13A and 13B. The breakdown current of the electrostatic protection circuit can thereby be increased, improving the electrostatic breakdown strength.

A transistor having a larger leakage current than the thyristor TH13 of the circuit block 13 shown in FIG. 3 is also used in the second embodiment. Accordingly, when the potential of the node N1 is higher than the potential of the node N2 during normal operation, the voltage between both ends of each of the circuit blocks 14a to 14d shown in FIGS. 10A to 10D will be smaller than the voltage between the anode and the cathode of the thyristor TH13.

Third Embodiment

Figure 14:
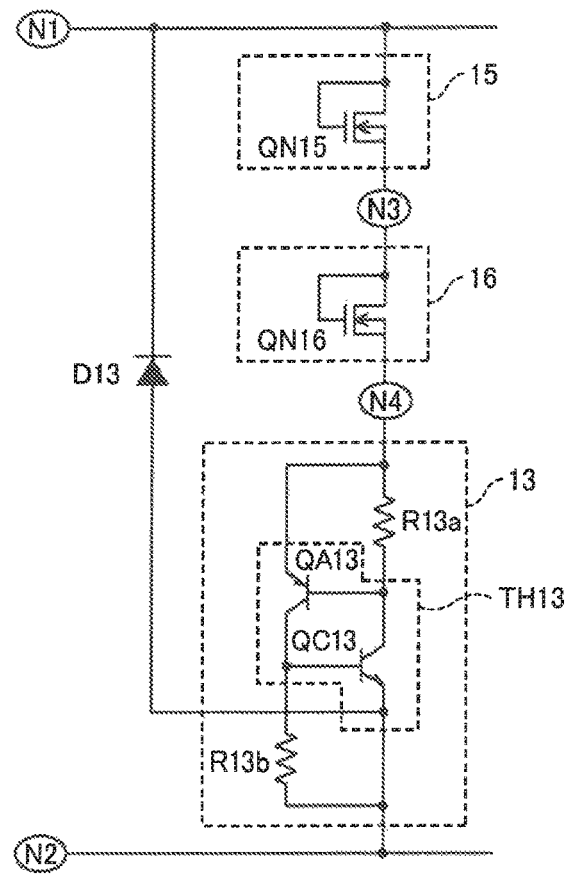
FIG. 14 is a circuit diagram showing an exemplary configuration of an electrostatic protection circuit according to a third embodiment of the invention.

FIG. 14 is a circuit diagram showing an exemplary configuration of an electrostatic protection circuit according to a third embodiment of the invention. In the third embodiment, circuit blocks 15 and 16 are provided, instead of the circuit blocks 11 and 12, in the electrostatic protection circuit according to the first embodiment shown in FIG. 3. In other regards, the third embodiment may be configured similarly to the first embodiment.

As shown in FIG. 14, an electrostatic protection circuit according to the third embodiment includes the circuit blocks 15, 16 and 13 connected in series between a node N1 and a node N2. The configuration shown in FIG. 14 is one example, and the number and connection order of the circuit blocks are arbitrary.

The circuit block 15 includes an N-channel MOS transistor QN15 in which the gate is connected to the drain. The transistor QN15 has a drain and a gate connected to one end (node N1) of the circuit block 15 and a source connected to the other end (node N3) of the circuit block 15, and allows discharge current to flow when the potential of the node N1 becomes higher than the potential of the node N2 and the voltage between both ends of the circuit block 15 reaches the threshold voltage.

Similarly, the circuit block 16 includes an N-channel MOS transistor QN16 in which the gate is connected to the drain. The transistor QN16 has a drain and a gate connected to one end (node N3) of the circuit block 16 and a source connected to the other end (node N4) of the circuit block 16, and allows discharge current to flow when the potential of the node N1 becomes higher than the potential of the node N2 and the voltage between both ends of the circuit block 14 reaches the threshold voltage.

In order to form the transistor QN15 or QN16 in the case of electrically isolating the source and the back gate (P-well) of the transistor QN15 or QN16 from the node N2, a triple well structure is used.

Because the transistors QN15 and QN16 are connected so as to always be in an ON state when a voltage greater than or equal to the threshold voltage is applied to each of the circuit blocks 15 and 16, the drain-source voltage of the transistors will be a sufficiently lower voltage than their respective maximum operating voltages. Accordingly, during normal operation, a deterioration in characteristics or breakdown of the transistors QN15 and QN16 does not result.

Also, because the transistors QN15 and QN16 are connected so as to always be in an ON state when a voltage greater than or equal to the threshold voltage is applied to each of the circuit blocks 15 and 16, the ratio of the voltages that are applied to the circuit blocks 15, 16 and 13 during normal operation is decided by the current that flows to the circuit blocks 15, 16 and 13. It is thereby possible to accurately prevent breakdown of the protected circuit immediately after power on, and to prevent breakdown or deterioration of the protection device during prolonged normal operation, without connecting a resistance element in parallel to the circuit blocks 15, 16 and 13.

Figures 15A, 15B:
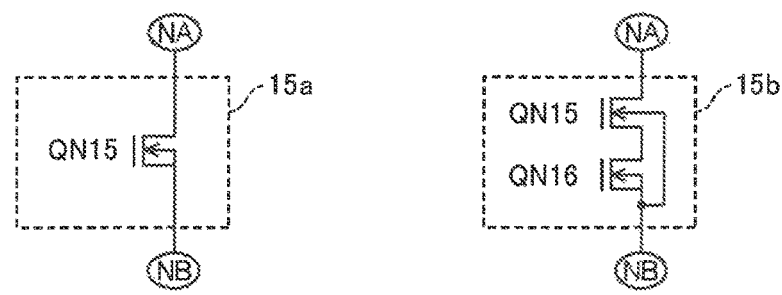
FIGS. 15A and 15B are diagrams showing circuit blocks that are used in a modification of the third embodiment.

FIGS. 15A and 15B are diagrams showing circuit blocks that are used in a modification of the third embodiment of the invention. Either of circuit blocks 15a and 15b shown in FIGS. 15A and 15B may be provided, instead of the circuit block 15 or 16, in the electrostatic protection circuit according to the third embodiment shown in FIG. 14.

The circuit block 15a includes a transistor QN15 connected between a node NA and a node NB. The gate of the transistor QN15 is in an open state. At the time of normal operation, leakage current flows from the drain of the transistor QN15 to the source. Also, the transistor QN15 allows discharge current to flow when the potential of the node N1 becomes higher than the potential of the node N2 and the voltage between both ends of the circuit block 15a reaches the breakdown voltage.

The circuit block 15b includes transistors QN15 and QN16 connected in series between a node NA and a node NB. The gate of the transistors QN15 and QN16 may be in an open state or may be connected to the drain. The transistors QN15 and QN16 are formed in the same P-well.

Figure 16A:
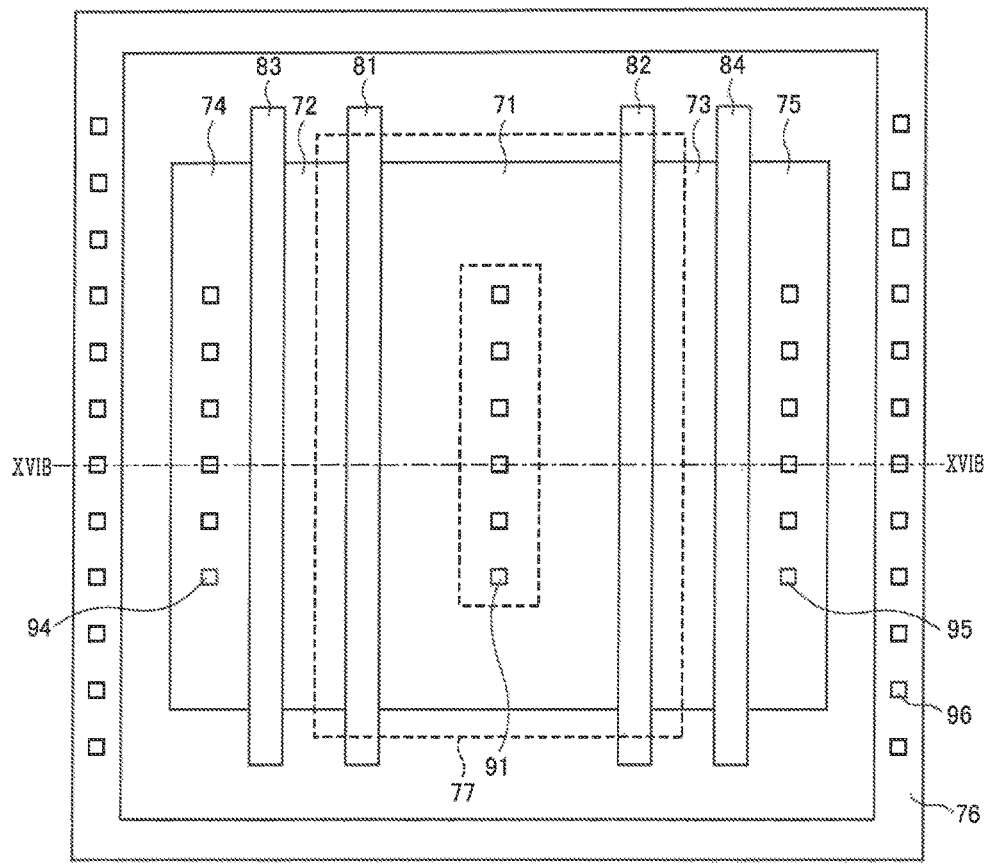
FIGS. 16A and 16B are diagrams showing a first exemplary layout of an N-channel MOS transistor.
Figure 16B:
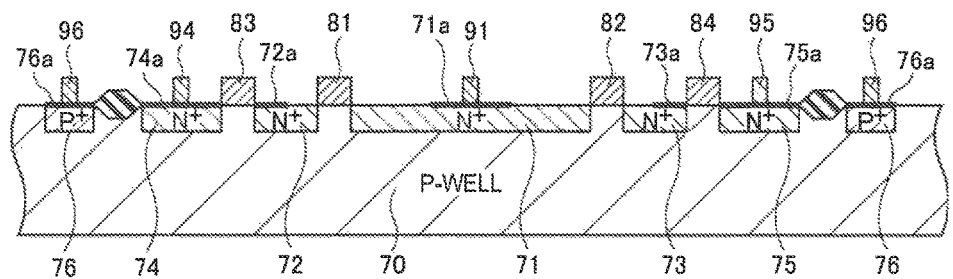

FIGS. 16A and 16B are diagrams showing a first exemplary layout of the N-channel MOS transistor shown in FIG. 15B. FIG. 16A is a plan view, and FIG. 16B is a cross-sectional view along XVIB-XVIB shown in FIG. 16A.

In the first exemplary layout, in the case where a plurality of N-channel MOS transistors connected in series are provided, the portion of the N+ impurity diffusion region on the both sides of the gate of the N-channel MOS transistor to which the highest potential is applied out of the plurality thereof is an unsilicided region. On the other hand, in the case where a plurality of P-channel MOS transistors connected in series are provided, the portion of the P+ impurity diffusion region of the both sides of the gate of the P-channel MOS transistor to which the lowest potential is applied out of the plurality thereof is an unsilicided region.

As shown in FIGS. 16A and 16B, within a P-well 70 are formed an N+ impurity diffusion region 71 serving as the drain of the transistor QN15, and N+ impurity diffusion regions 72 and 73 serving as the source of the transistor QN15 and the drain of the transistor QN16. Also, N+ impurity diffusion regions 74 and 75 serving as the source of the transistor QN16 and a P+ impurity diffusion region 76 for providing a potential to the P-well 70 are formed. Furthermore, on the P-well 70 are formed gate electrodes 81 and 82 of the transistor QN15 and gate electrodes 83 and 84 of the transistor QN16, via a gate insulation film (not shown).

Contacts 91 and 94 to 96 are respectively electrically connected to the impurity diffusion regions 71 and 74 to 76. In the N+ impurity diffusion regions 71 to 75 serving as the drain and the source of the N-channel MOS transistor, predetermined regions 71a to 75a including the portion that the contacts 91, 94 and 95 contact are silicided, and a remaining region 77 thereof is not silicided. Also, in the P+ impurity diffusion region 76, a region 76a including the portion that the contact 96 contacts is silicided.

In the first exemplary layout, the specific resistance of the N+ impurity diffusion regions 71 to 73 serving as the drain and the source of the transistor QN15 is large, and thus uniform discharge is performed toward the gates 81 and 82 from the contact 91 on the drain of the transistor QN15, without concentrating at one point. The breakdown current of the electrostatic protection circuit can thereby be increased, improving the electrostatic breakdown strength.

Figure 17A:
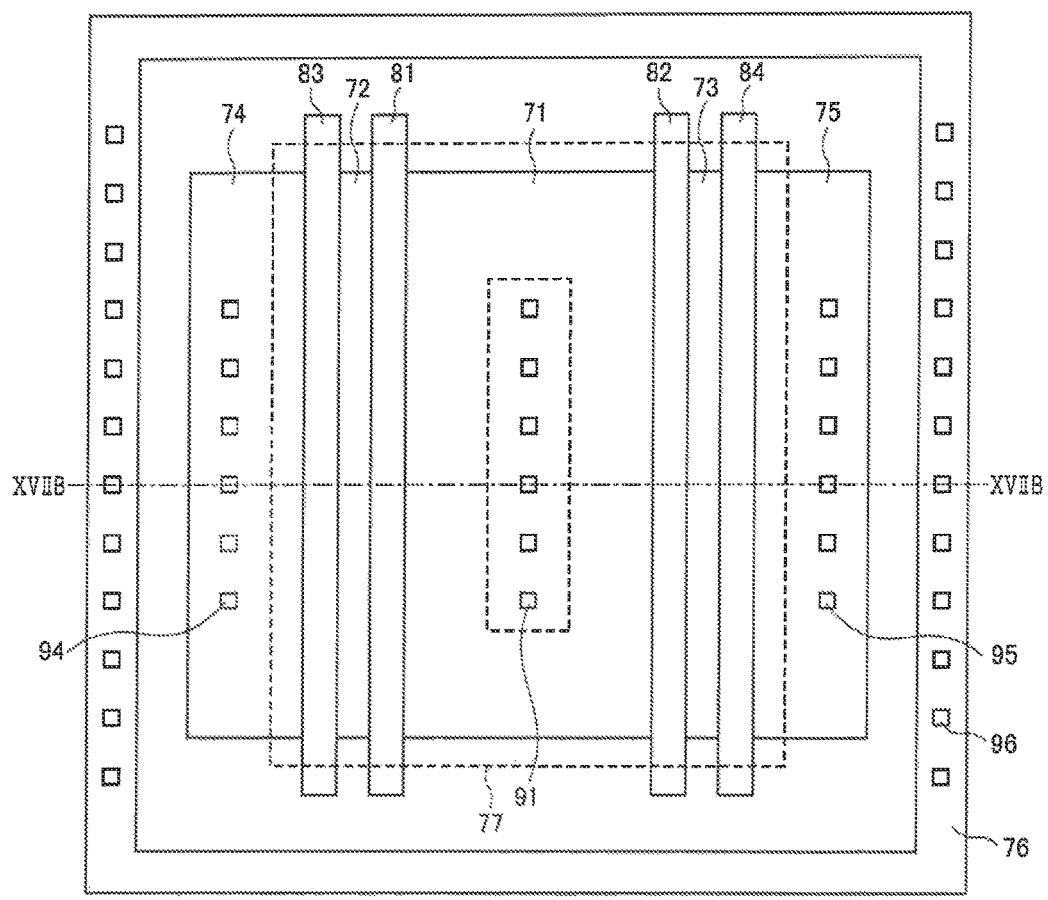
FIGS. 17A and 17B are diagrams showing a second exemplary layout of an N-channel MOS transistor.
Figure 17B:
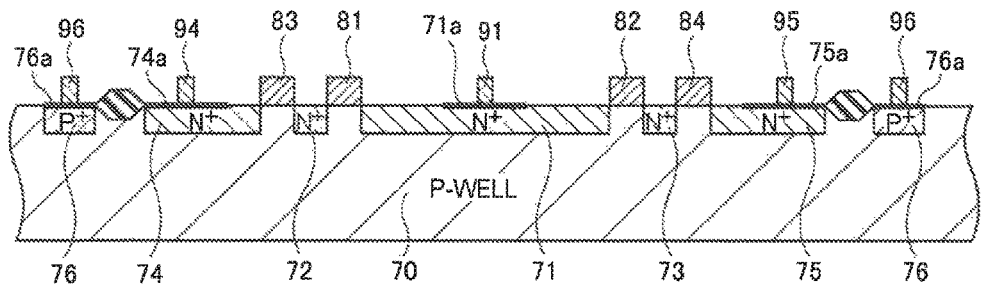

FIGS. 17A and 17B are diagrams showing a second exemplary layout of the N-channel MOS transistor shown in FIG. 15B. FIG. 17A is a plan view, and FIG. 17B is a cross-sectional view along XVIIB-XVIIB shown in FIG. 17A.

In the second exemplary layout, in the case where a plurality of N-channel MOS transistors connected in series are provided, the portion of the N+ impurity diffusion region of the both sides of the gate of all of the N-channel MOS transistors is an unsilicided region. On the other hand, in the case where a plurality of P-channel MOS transistors connected in series are provided, the portion of the P+ impurity diffusion region of the both sides of the gate of all of the P-channel MOS transistors is an unsilicided region. In other regards, the second exemplary layout may be configured similarly to the first exemplary layout.

Contacts 91 and 94 to 96 are respectively electrically connected to the impurity diffusion regions 71 and 74 to 76. In the N+ impurity diffusion regions 71 to 75 serving as the drain and the source of the N-channel MOS transistor, predetermined regions 71a, 74a and 75a including the portion that the contacts 91 and 94 to 95 contact are silicided, and a remaining region 77 thereof is not silicided. Also, in the P+ impurity diffusion region 76, a region 76a including the portion that the contact 96 contacts is silicided.

In the second exemplary layout, the specific resistance of the N+ impurity diffusion regions 71 to 75 serving as the drain and the source of the transistors QN15 and QN16 is large, and thus the hold voltage is higher than the first exemplary layout.

Fourth Embodiment

Figure 18:
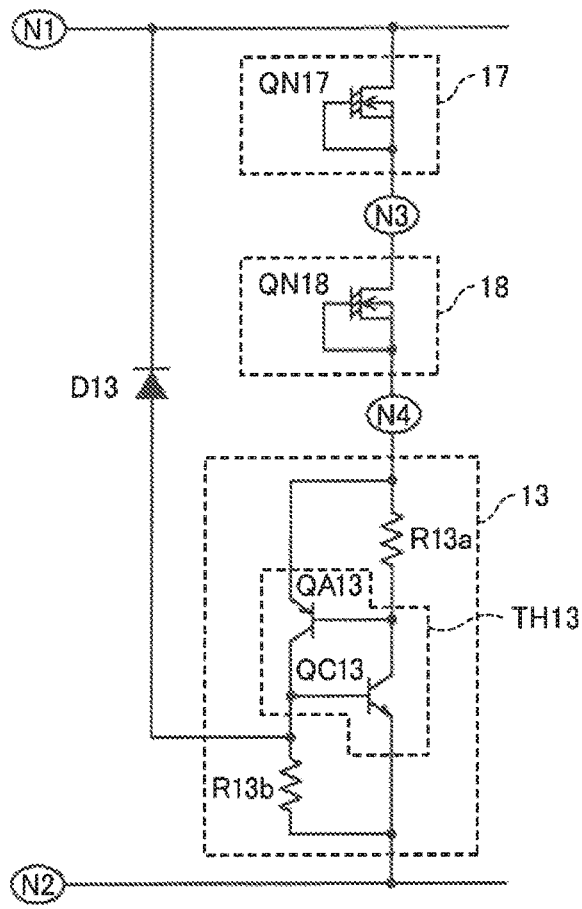
FIG. 18 is a circuit diagram showing an exemplary configuration of an electrostatic protection circuit according to a fourth embodiment of the invention.

FIG. 18 is a circuit diagram showing an exemplary configuration of an electrostatic protection circuit according to a fourth embodiment of the invention. In the fourth embodiment, circuit blocks 17 and 18 are provided, instead of the circuit blocks 11 and 12, in the electrostatic protection circuit according to the first embodiment shown in FIG. 3. In other regards, the fourth embodiment may be configured similarly to the first embodiment.

As shown in FIG. 18, the electrostatic protection circuit according to the fourth embodiment includes the circuit blocks 17, 18 and 13 connected in series between a node N1 and a node N2. The configuration shown in FIG. 18 is one example, and the number and connection order of the circuit blocks are arbitrary.

The circuit block 17 includes a depletion-type N-channel MOS transistor QN17 in which the gate is connected to the source. The transistor QN17 has a drain connected to one end (node N1) of the circuit block 17, and a source and a gate connected to the other end (node N3) of the circuit block 17, and allows discharge current to flow when the potential of the node N1 becomes higher than the potential of the node N2 and a positive voltage is applied between both ends of the circuit block 17.

Similarly, the circuit block 18 includes a depletion-type N-channel MOS transistor QN18 in which the gate is connected to the source. The transistor QN18 has a drain connected to one end (node N3) of the circuit block 18 and a source and a gate connected to the other end (node N4) of the circuit block 18, and allows discharge current to flow when the potential of the node N1 becomes higher than the potential of the node N2 and a positive voltage is applied between both ends of the circuit block 18.

In the transistor QN17 or QN18, the gate may be in an open state. Also, in the case where a plurality of N-channel MOS transistors connected in series are provided, those N-channel MOS transistors may be formed in the same P-well. The gate of those N-channel MOS transistors may be in an open state or may be connected to the source.

Because the depletion-type transistors QN17 and QN18 always enter an ON state when a positive voltage is applied to each of the circuit blocks 17 and 18, the drain-source voltage of the transistors QN17 and QN18 will be a sufficiently lower voltage than the respective maximum operating voltages. Accordingly, during normal operation, a deterioration in characteristics or breakdown of the transistors QN17 and QN18 does not result.

Also, because the depletion-type transistors QN17 and QN18 always enter an ON state when a positive voltage is applied to each of the circuit blocks 17 and 18, the ratio of the voltages that are applied to the circuit blocks 17, 18 and 13 during normal operation is decided by the current that flows to the circuit blocks 17, 18 and 13. It is thereby possible to accurately prevent breakdown of the protected circuit immediately after power on, and to prevent breakdown or deterioration of the protection device during prolonged normal operation, without connecting a resistance element in parallel to the circuit blocks 17, 18 and 13.

Figure 19:
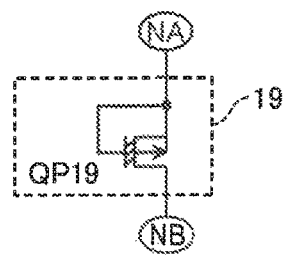
FIG. 19 is a circuit diagram showing circuit blocks that are used in a modification of the fourth embodiment.

FIG. 19 is a circuit diagram showing an exemplary configuration of a circuit block used in a modification of the fourth embodiment of the invention. In the modification of the fourth embodiment, a circuit block 19 shown in FIG. 19 is used, instead of the circuit block 17 or 18, in the electrostatic protection circuit according to the fourth embodiment shown in FIG. 18.

The circuit block 19 includes a depletion-type P-channel MOS transistor QP19 in which the gate is connected to the source. The transistor QP19 has a source and a gate connected to one end (node NA) of the circuit block 19 and a drain connected to the other end (node NB) of the circuit block 19, and allows discharge current to flow when the potential of the node N1 becomes higher than the potential of the node N2 and a positive voltage is applied between both ends of the circuit block 19.

In the transistor QP19, the gate may be in an open state. Also, in the case where a plurality of P-channel MOS transistors connected in series are provided, those P-channel MOS transistors may be formed in the same N-well. The gate of those P-channel MOS transistors may be in an open state or may be connected to the source.

Because the depletion-type transistor QP19 always enters an ON state when a positive voltage is applied between both ends of the circuit block 19, the source-drain voltage of the transistor QP19 will be a sufficiently lower voltage than the maximum operating voltage of the transistor QP19. Accordingly, during normal operation, a deterioration in characteristics or breakdown of the transistor QP19 does not result.

Also, because the depletion-type transistor QP19 always enters an ON state when a positive voltage is applied between both ends of the circuit block 19, the ratio of the voltages that are applied to the plurality of circuit blocks during normal operation is decided by the current that flows to those circuit blocks. It is thereby possible to accurately prevent breakdown of the protected circuit immediately after power on, and to prevent breakdown or deterioration of the protection device during prolonged normal operation, without connecting a resistance element in parallel to those circuit blocks.

Fifth Embodiment

Figure 20:
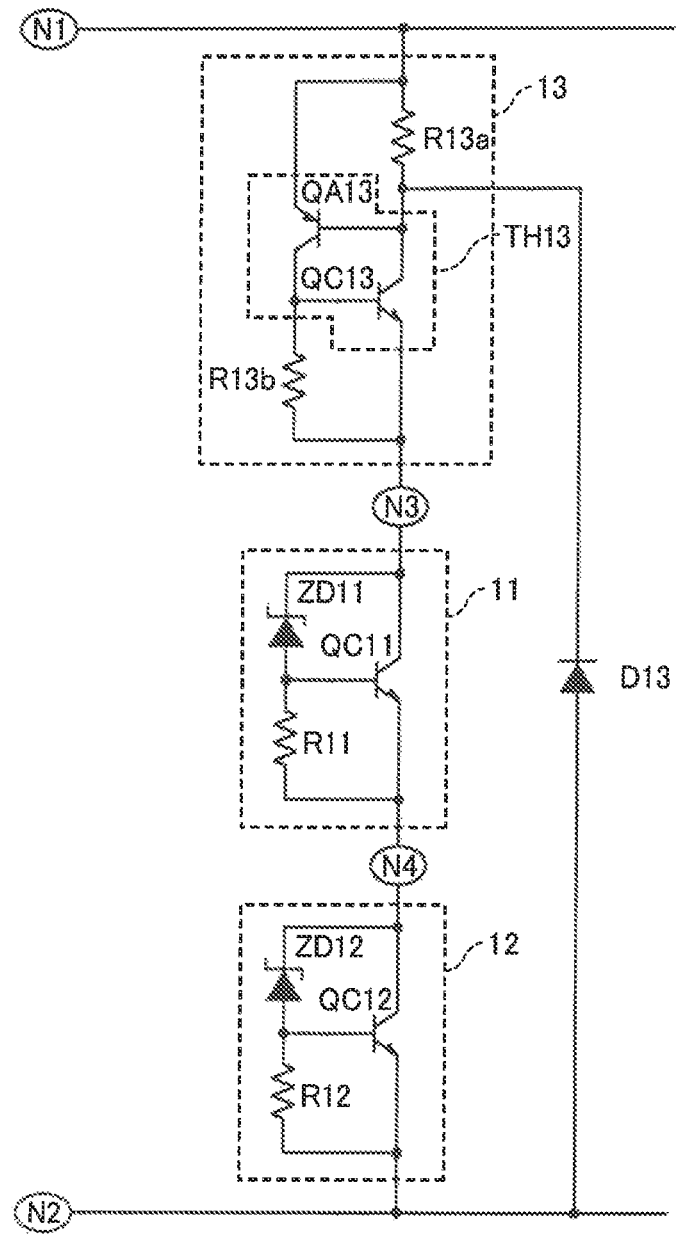
FIG. 20 is a circuit diagram showing circuit blocks that are used in a fifth embodiment of the invention.

FIG. 20 is a circuit diagram showing an exemplary configuration of circuit blocks that are used in the fifth embodiment of the invention. An electrostatic protection circuit according to the fifth embodiment is a circuit obtained by changing the connection order of the circuit blocks 11 to 13 and changing the connection position of the diode D13, in the electrostatic protection circuit according to the first embodiment shown in FIG. 3. In other regards, the fifth embodiment may be configured similarly to the first embodiment.

The diode D13 is connected between the base of the transistor QA13 (N-gate of the thyristor TH13) and the node N2, and has a cathode connected to the base of the transistor QA13 and an anode electrically connected to the node N2. The diode D13 allows current to flow to the circuit block 13 when the potential of the node N1 becomes higher than the potential of the node N2 and the voltage between the cathode and the anode reaches the breakdown voltage. That is, when current flows to the resistance element R13a and the emitter-base voltage of the transistor QA13 becomes greater than or equal to the threshold voltage, current also flows to the base of the transistor QA13.

When current flows to the base of the transistor QA13, the transistor QA13 enters an ON state, allowing current to flow from the node N1 to the node N3. Also, when a potential difference occurs between both ends of the resistance element R13b and the base-emitter voltage of the transistor QC13 becomes greater than or equal to the threshold voltage, the transistor QC13 enters an ON state. The voltage between the node N1 and the node N3 is clamped as a result of the above operations.

The hold voltage of the electrostatic protection circuit shown in FIG. 20 will be the sum of the hold voltages of the circuit blocks 11 to 13. Also, the trigger voltage can be set with the breakdown voltage of the diode D13.

Figure 21A:
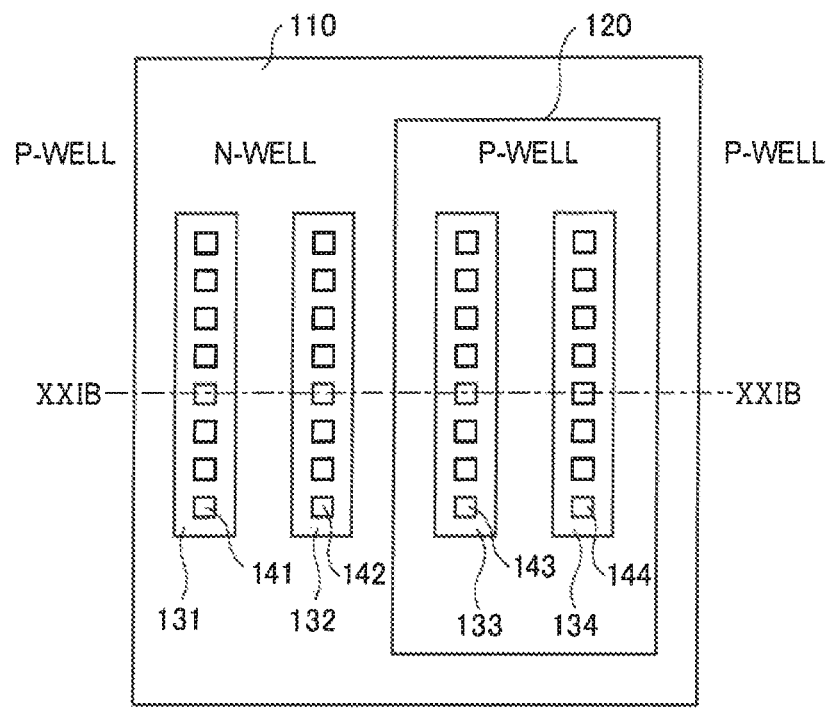
FIGS. 21A and 21B are diagrams showing an exemplary layout of a thyristor shown in FIG. 20.
Figure 21B:
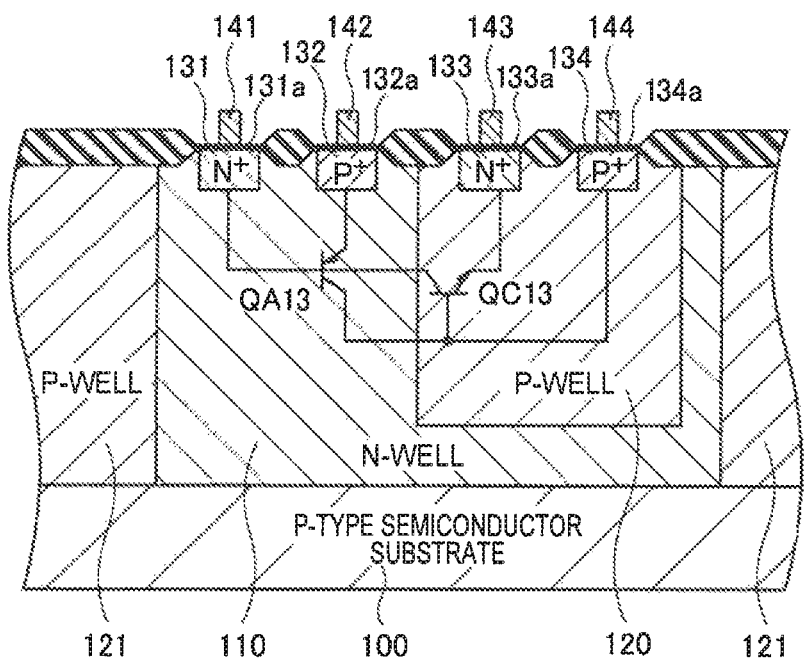

FIGS. 21A and 21B are diagrams showing an exemplary layout of the thyristor shown in FIG. 20. FIG. 21A is a plan view, and FIG. 21B is a cross-sectional view along XXIB-XXIB shown in FIG. 21A. As shown in FIGS. 21A and 21B, an N-well 110 and a P-well 121 are formed within a P-type semiconductor substrate (e.g., silicon substrate) 100, and a P-well 120 is further formed in the N-well 110 to constitute a triple well structure. In other regards, the exemplary layout shown in FIGS. 21A and 21B may be constituted similarly to the exemplary layout shown in FIGS. 4A and 4B. By using a triple well structure, the emitter of the transistor QC13 can be electrically isolated from the potential of the P-type semiconductor substrate 100.

Similar effects to the first embodiment can also be achieved according to this embodiment. Furthermore, a diode that is constituted by the P-well 121 and an N$^+$ impurity diffusion region can be used as the diode D13. Also, the circuit configuration can be decided according to the characteristics of the breakdown voltage of the diode D13.

Sixth Embodiment

Figure 22:
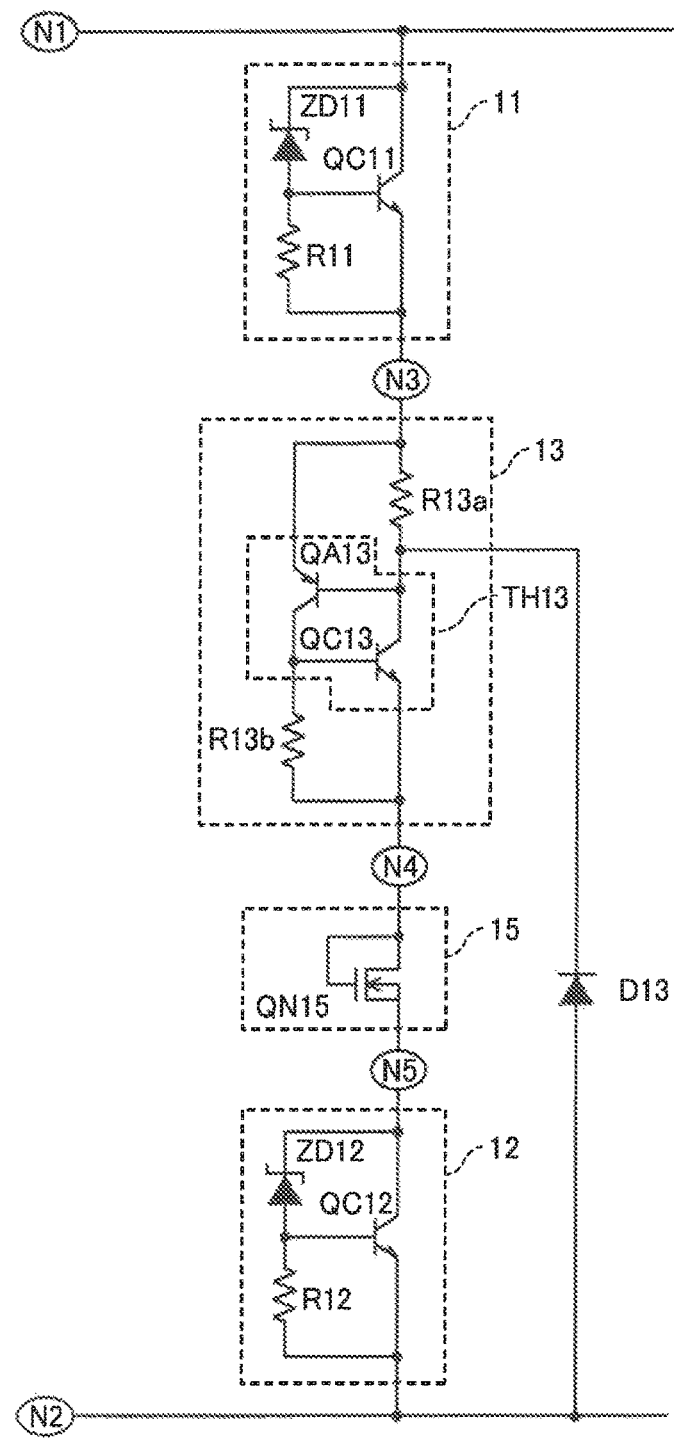
FIG. 22 is a circuit diagram showing an exemplary configuration of an electrostatic protection circuit according to a sixth embodiment of the invention.

FIG. 22 is a circuit diagram showing an exemplary configuration of an electrostatic protection circuit according to a sixth embodiment of the invention. The electrostatic protection circuit according to the sixth embodiment is a circuit obtained by changing the connection order of the circuit blocks 11 to 13 and adding the circuit block 15 shown in FIG. 14, in the electrostatic protection circuit according to the fifth embodiment shown in FIG. 20. In other regards, the sixth embodiment may be configured similarly to the fifth embodiment.

As shown in FIG. 22, the electrostatic protection circuit according to the sixth embodiment includes the circuit blocks 11, 13, 15 and 12 connected in series between the node N1 and the node N2. The configuration shown in FIG. 22 is one example, and the number and connection order of the circuit blocks are arbitrary. The hold voltage of the electrostatic protection circuit shown in FIG. 22 will be the sum of the hold voltages of the circuit blocks 11, 13, 15 and 12. Also, the trigger voltage will be the sum of the trigger voltage of the circuit block 11 and the breakdown voltage of the diode D13.

Although, in FIG. 22, the diode D13 is connected between the base of the transistor QA13 (N-gate of the thyristor TH13) and the node N2, the diode D13 may be connected between the base of the transistor QA13 and a node N5. In that case, the trigger voltage of the electrostatic protection circuit will be the sum of the trigger voltage of the circuit block 11, the trigger voltage of the circuit block 12 and the breakdown voltage of the diode D13. Accordingly, the trigger voltage of the electrostatic protection circuit can be set with the sum of the breakdown voltage of the diode D13 and the trigger voltages of a number of devices.

The trigger voltage and the hold voltage of the electrostatic protection circuit can thus be set comparatively arbitrarily, by combining voltages with consideration for the trigger voltages and the hold voltages of various devices. Furthermore, in the case of using a zener trigger bipolar transistor or a zener trigger thyristor as a device, the breakdown voltage of the zener diode can be arbitrarily set by ion doping, thus enabling the trigger voltage and the hold voltage to be set more finely.

Seventh Embodiment

Figure 23:
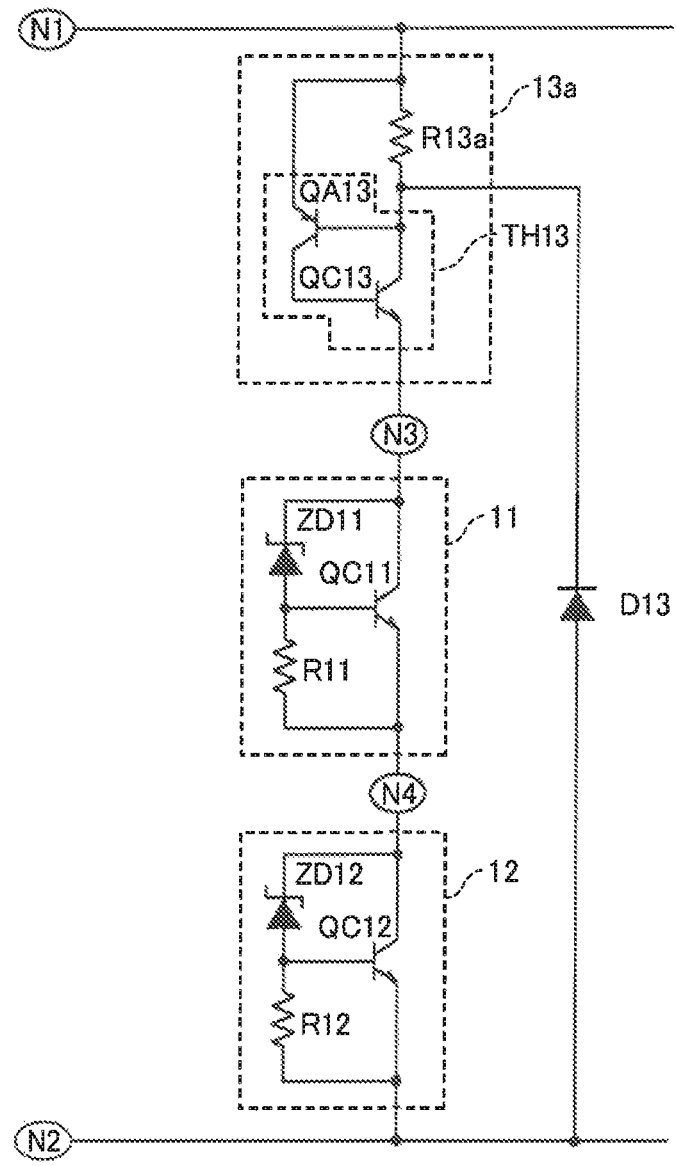
FIG. 23 is a circuit diagram showing an exemplary configuration of an electrostatic protection circuit according to a seventh embodiment of the invention.

FIG. 23 is a circuit diagram showing an exemplary configuration of an electrostatic protection circuit according to a seventh embodiment of the invention. In the seventh embodiment, a circuit block 13a in which the resistance element 13b is omitted from the circuit block 13 is provided, instead of the circuit block 13, in the electrostatic protection circuit according to the fifth embodiment shown in FIG. 20.

In other regards, the seventh embodiment may be configured similarly to the fifth embodiment.

As shown in FIG. 23, the electrostatic protection circuit according to the seventh embodiment includes the circuit blocks 13a, 11 and 12 connected in series between a node N1 and a node N2. The configuration shown in FIG. 23 is one example, and the number and connection order of the circuit blocks are arbitrary. The hold voltage of the electrostatic protection circuit shown in FIG. 23 will be the sum of the hold voltages of the circuit blocks 13a, 11 and 12. Also, the trigger voltage can be set with the breakdown voltage of the diode D13.

For example, the thyristor TH13 of the circuit block 13a is formed using a twin well structure. Also, the P-gate of the thyristor TH13 is electrically connected to the node N2 (P-type semiconductor substrate) via a parasitic resistor (not shown) of the P-well. Accordingly, the resistance element R13b of the circuit block 13 shown in FIG. 20 no longer needs to be provided separately, thus enabling the circuit area to be reduced.

Figure 24A:
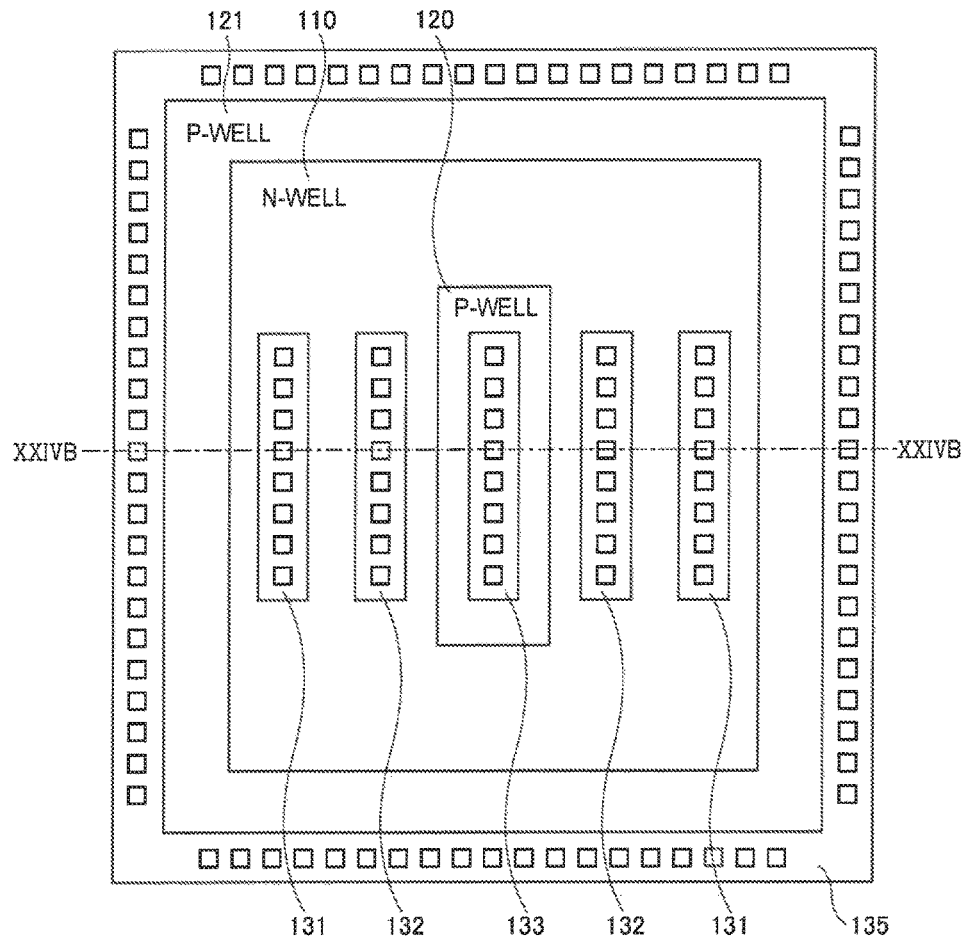
FIGS. 24A and 24B are diagrams showing a first exemplary layout of a thyristor shown in FIG. 23.
Figure 24B:
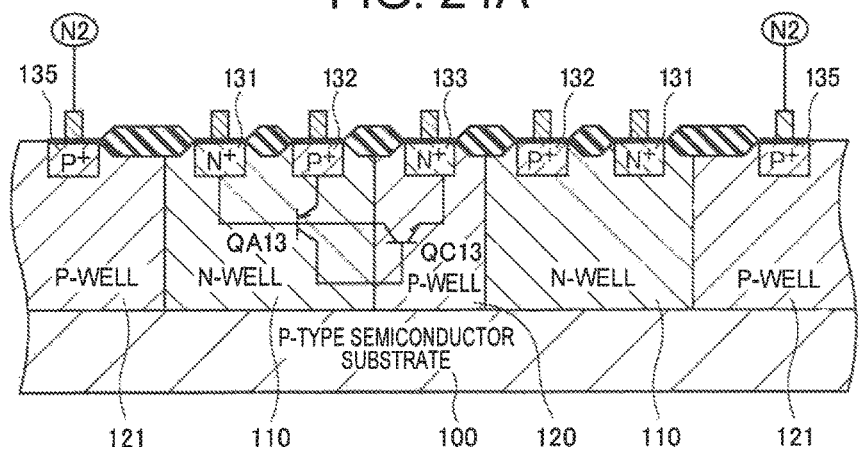

FIGS. 24A and 24B are diagrams showing a first exemplary layout in the case where the thyristor shown in FIG. 23 is configured with a twin well structure. FIG. 24A is a plan view, and FIG. 24B is a cross-sectional view along XXIVB-XXIVB shown in FIG. 24A. In the first exemplary layout, two thyristors that share a common cathode are arranged symmetrically. Hereinafter, the thyristor on the left side in the diagrams will be described.

As shown in FIGS. 24A and 24B, an N-well 110 and P-wells 120 and 121 are formed within a P-type semiconductor substrate (e.g., silicon substrate) 100. An N$^+$ impurity diffusion region 131 and a P$^+$ impurity diffusion region 132 are formed within the N-well 110. The N-well 110 and the N$^+$ impurity diffusion region 131 correspond to the base of the transistor QA13, that is, the N-gate of the thyristor TH13 shown in FIG. 23, and correspond to the collector of the transistor QC13. Also, the P$^+$ impurity diffusion region 132 corresponds to the emitter of the transistor QA13, that is, the anode of the thyristor TH13 shown in FIG. 23.

An N$^+$ impurity diffusion region 133 is formed within the P-well 120. The P-well 120 corresponds to the base of the transistor QC13, that is, the P-gate of the thyristor TH13 shown in FIG. 23, and corresponds to the collector of the transistor QA13. The N$^+$ impurity diffusion region 133 corresponds to the emitter of the transistor QC13, that is, the cathode of the thyristor TH13 shown in FIG. 23. A P$^+$ impurity diffusion region 135 electrically connected to the node N2 is formed within the P-well 121. The base of the transistor QC13 is electrically connected to the P-type semiconductor substrate 100 via a parasitic resistor of the P-well 120.

By the thyristor TH13 thus being configured with a twin well structure and the P-well 120 corresponding to the P-gate of the thyristor TH13 being surrounded in plan view by the N-well 110 corresponding to the N-gate of the thyristor TH13, the P-gate of the thyristor TH13 and the P-type semiconductor substrate 100 can be connected via a high impedance. Accordingly, an P$^+$ impurity diffusion region for controlling the potential of the P-gate of the thyristor TH13 and a resistance element that is connected to the P-gate become unnecessary, enabling the circuit area to be reduced. On the other hand, the transistor QC13 is more easily turned on, thus enabling the thyristor TH13 to be reliably set to an ON state with only the N-gate.

Figure 25:
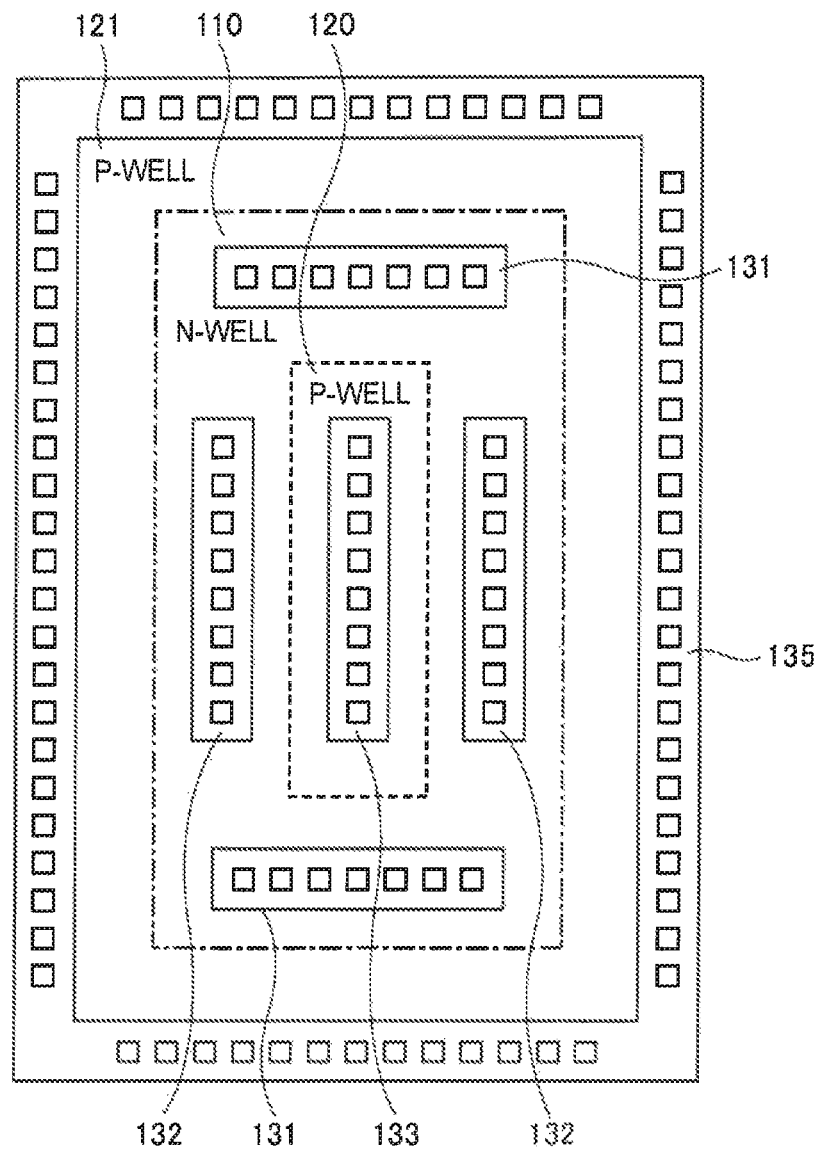
FIG. 25 is a plan view showing a second exemplary layout of the thyristor shown in FIG. 23.
Figure 26:
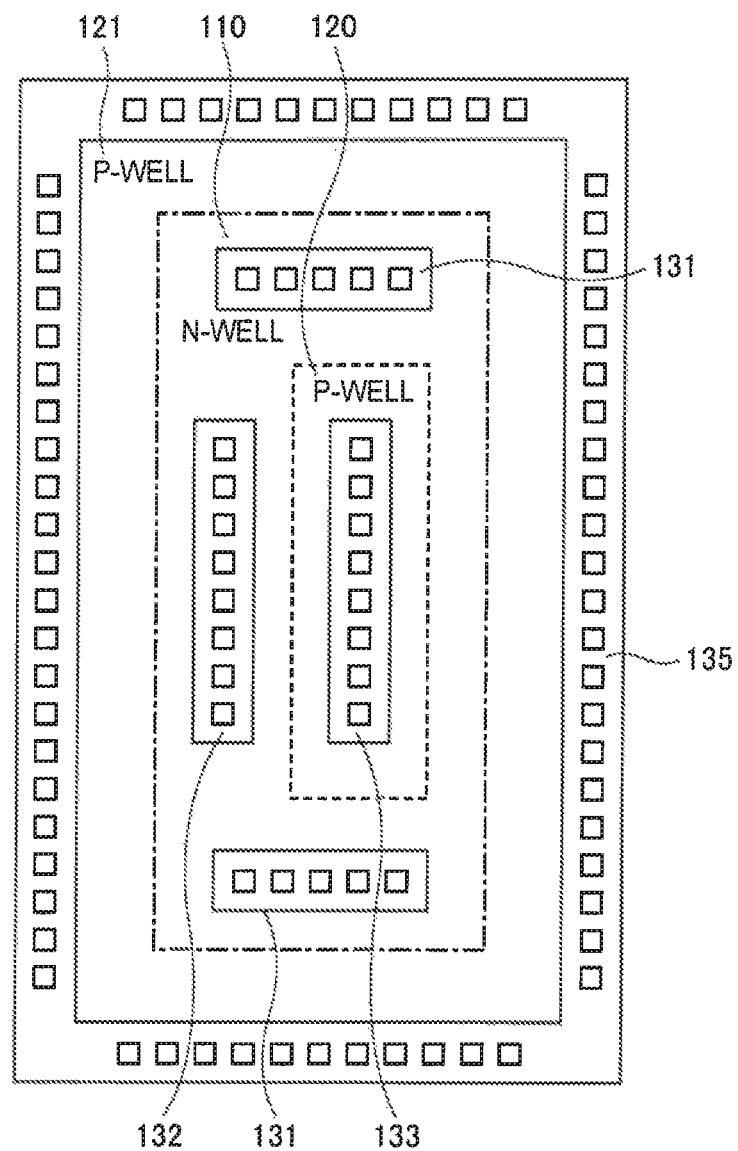
FIG. 26 is a plan view showing a third exemplary layout of the thyristor shown in FIG. 23.

FIG. 25 is a plan view showing a second exemplary layout in the case where the thyristor shown in FIG. 23 is configured with a twin well structure, and FIG. 26 is a plan view showing a third exemplary layout in the case where the thyristor shown in FIG. 23 is configured with a twin well structure. As shown in FIGS. 25 and 26, the N$^+$ impurity diffusion region 131 for controlling the potential of the N-gate may be arranged in positions above and below the P$^+$ impurity diffusion region 132 and the N$^+$ impurity diffusion region 133 in the diagrams. When the impurity diffusion regions 131 to 133 are arranged as shown in FIG. 25 or 26, the electrostatic protection circuit can be miniaturized in the width direction in the diagrams.

Eighth Embodiment

Figure 27:
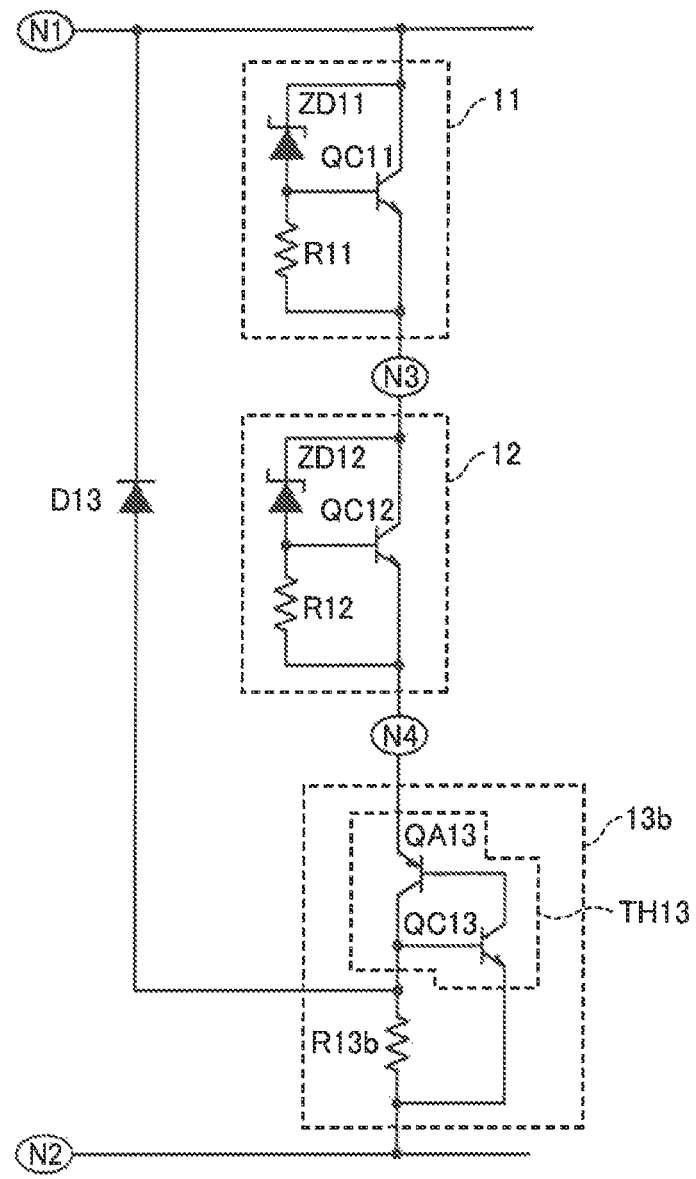
FIG. 27 is a circuit diagram showing an exemplary configuration of an electrostatic protection circuit according to an eighth embodiment of the invention.

FIG. 27 is a circuit diagram showing an exemplary configuration of an electrostatic protection circuit according to an eighth embodiment of the invention. In the eighth embodiment, a circuit block 13b in which the resistance element R13a is omitted from the circuit block 13 is provided, instead of the circuit block 13, in the electrostatic protection circuit according to the first embodiment shown in FIG. 3. In other regards, the eighth embodiment may be configured similarly to the first embodiment.

As shown in FIG. 27, the electrostatic protection circuit according to the eighth embodiment includes the circuit blocks 11, 12 and 13b connected in series between a node N1 and a node N2. The configuration shown in FIG. 27 is one example, and the number and connection order of the circuit blocks are arbitrary. The hold voltage of the electrostatic protection circuit shown in FIG. 27 will be the sum of the hold voltages of the circuit blocks 11, 12 and 13b. Also, the trigger voltage can be set by the breakdown voltage of the diode D13.

For example, the thyristor TH13 of the circuit block 13b is formed using a triple well structure. Also, the N-gate of the thyristor TH13 is electrically connected to the node N1 via parasitic resistors (not shown) of a deep N-well and an N-well. Accordingly, the resistance element 13a of the circuit block 13 shown in FIG. 3 no longer needs to be provided separately, thus enabling the circuit area to be reduced.

Figure 28A:
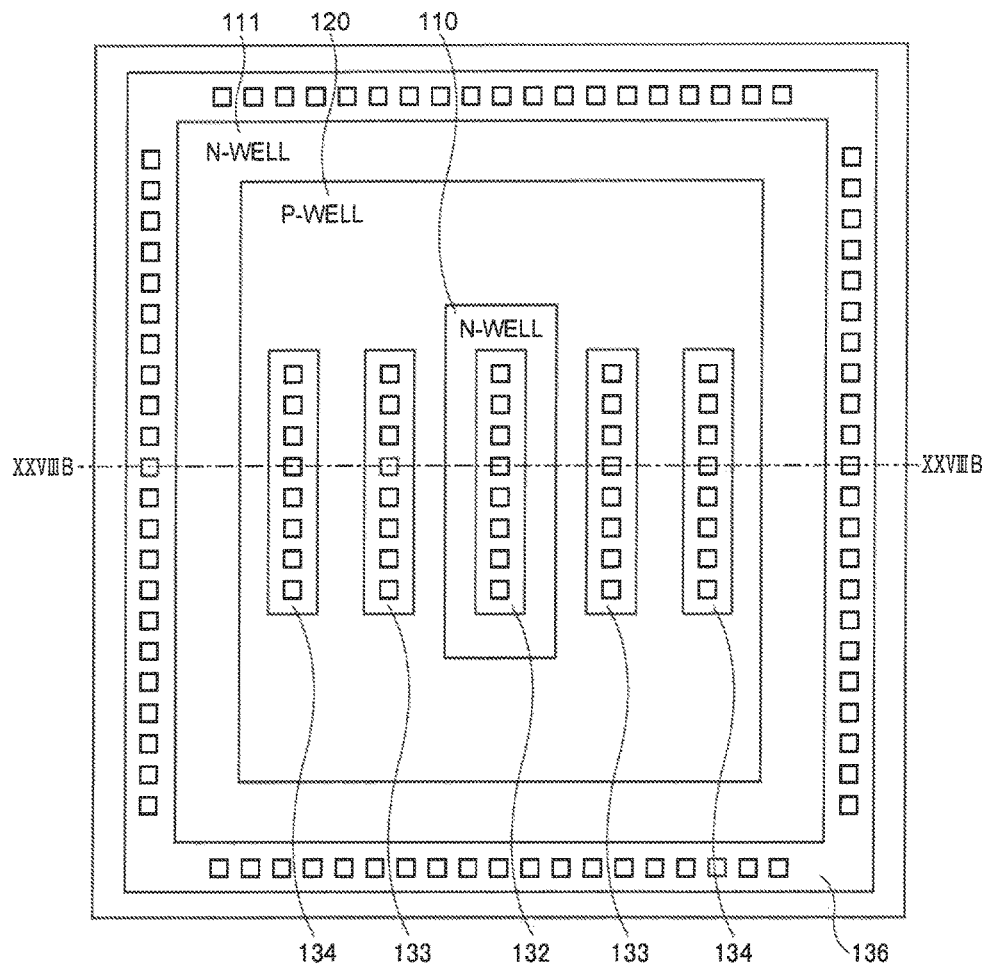
FIGS. 28A and 28B are diagrams showing an exemplary layout of a thyristor shown in FIG. 27.
Figure 28B:
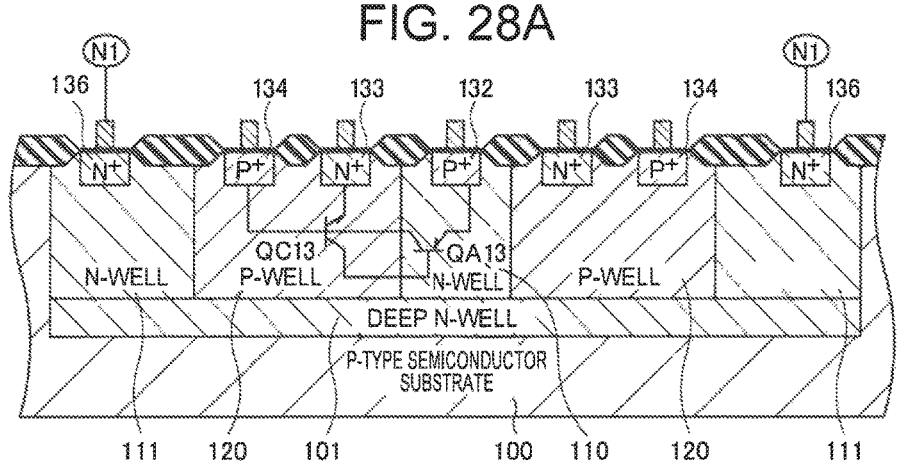

FIGS. 28A and 28B are diagrams showing an exemplary layout in the case where the thyristor shown in FIG. 27 is configured with a triple well structure. FIG. 28A is a plan view, and FIG. 28B is a cross-sectional view along XXVIIIB-XXVIIIB shown in FIG. 28A. In this exemplary layout, two thyristors that share a common anode are arranged symmetrically. Hereinafter, the thyristor on the left side in the diagrams will be described.

As shown in FIGS. 28A and 28B, a deep N-well 101, N-wells 110 and 111 and a P-well 120 are formed within a P-type semiconductor substrate (e.g., silicon substrate) 100. A P$^+$ impurity diffusion region 132 is formed within the N-well 110. The N-well 110 corresponds to the base of a transistor QA13, that is, the N-gate of the thyristor TH13 shown in FIG. 27, and corresponds to the collector of the transistor QC13. Also, a P$^+$ impurity diffusion region 132 corresponds to the emitter of the transistor QA13, that is, the anode of the thyristor TH13 shown in FIG. 27.

An N$^+$ impurity diffusion region 133 and a P$^+$ impurity diffusion region 134 are formed within the P-well 120. The P-well 120 and the P$^+$ impurity diffusion region 134 correspond to the base of the transistor QC13, that is, the P-gate of the thyristor TH13 shown in FIG. 27, and correspond to the collector of the transistor QA13. The N$^+$ impurity diffusion region 133 corresponds to the emitter of the transistor QC13, that is, the cathode of the thyristor TH13 shown in FIG. 27. An N$^+$ impurity diffusion region 136 electrically connected to the node N1 is formed within the N-well 111. The base of the transistor QA13 is electrically connected to the node N1 via parasitic resistors of the N-well 110, the deep N-well 101 and the N-well 111.

By the thyristor TH13 thus being configured with a triple well structure and the N-well 110 corresponding to the N-gate of the thyristor TH13 being surrounded in plan view by the P-well 120 corresponding to the P-gate of the thyristor TH13, the N-gate of the thyristor TH13 and the node N1 can be connected via a high impedance. Accordingly, an $N^+$ impurity diffusion region for controlling the potential of the N-gate of the thyristor TH13 and a resistance element that is connected to the N-gate become unnecessary, enabling the circuit area to be reduced. On the other hand, the transistor QA13 is more easily turned on, thus enabling the thyristor TH13 to be reliably set to an ON state with only the P-gate.

Ninth Embodiment

Figure 29:
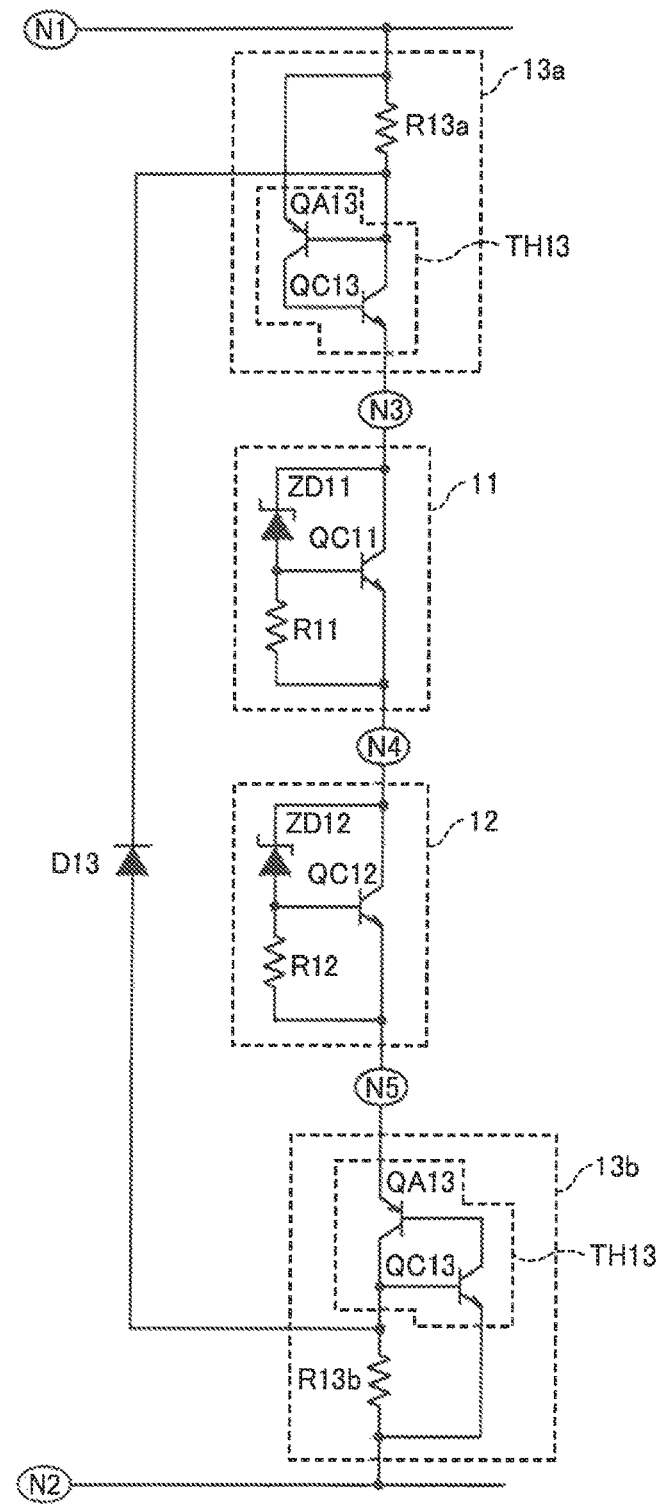
FIG. 29 is a circuit diagram showing an exemplary configuration of an electrostatic protection circuit according to a ninth embodiment of the invention.

FIG. 29 is a circuit diagram showing an exemplary configuration of an electrostatic protection circuit according to a ninth embodiment of the invention. In the electrostatic protection circuit according to the ninth embodiment, the circuit blocks 13a, 11 and 12 shown in FIG. 23 and the circuit block 13b shown in FIG. 27 are connected in series between a node N1 and a node N2. The cathode of the diode D13 is connected to the N-gate of the thyristor TH13 of the circuit block 13a, and the anode of the diode D13 is connected to the P-gate of the thyristor TH13 of the circuit block 13b. In other regards, the ninth embodiment may be configured similarly to the seventh or eighth embodiment.

For example, the thyristor TH13 of the circuit block 13a is configured with a twin well structure. The layout of the circuit block 13a may be configured similarly to the layout shown in FIGS. 24A and 24B. Also, the thyristor TH13 of the circuit block 13b is configured with a triple well structure. The layout of the circuit block 13b may be configured similarly to the layout shown in FIGS. 28A and 28B.

According to the ninth embodiment, the hold voltage of the electrostatic protection circuit is higher by the hold voltage of one thyristor, in comparison with the electrostatic protection circuit shown in FIG. 23 or 27. Because the hold voltage of a thyristor is comparatively low, it becomes possible to finely adjust the hold voltage of the electrostatic protection circuit.

Tenth Embodiment

In the first to ninth embodiments, one diode D13 is used in order to set the trigger voltage, whereas in the electrostatic protection circuit according to the tenth embodiment, an overvoltage detection circuit 150 is provided, instead of the diode D13. In other regards, the tenth embodiment may be configured similarly to any of the first to ninth embodiments.

Figure 30:
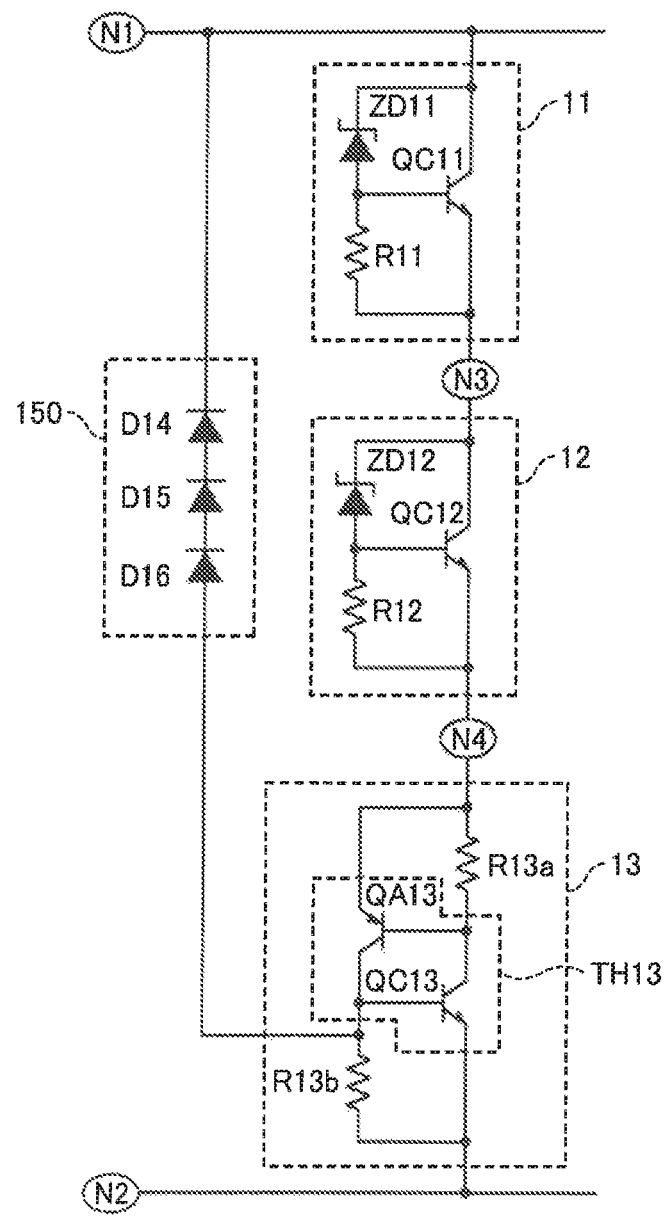
FIG. 30 is a circuit diagram showing an exemplary configuration of an electrostatic protection circuit according to a tenth embodiment of the invention.

FIG. 30 is a circuit diagram showing an exemplary configuration of the electrostatic protection circuit according to the tenth embodiment of the invention. In the tenth embodiment, the overvoltage detection circuit 150 is provided, instead of the diode D13, in the electrostatic protection circuit according to the first embodiment shown in FIG. 3. For example, the overvoltage detection circuit 150 shown in FIG. 30 includes a plurality of diodes D14 to D16 connected in series. The breakdown voltage of the diodes D14 to D16 is set lower than the breakdown voltage of the thyristor TH13.

The overvoltage detection circuit 150 has one end connected to the P-gate of the thyristor TH13 shown in FIG. 30 and the other end connected to the N-gate of the thyristor TH13 shown in FIG. 20, and allows current to flow to the circuit block 13 including the thyristor TH13 when the potential of the node N1 becomes higher than the potential of the node N2 and the voltage between both ends reaches the breakdown voltage.

In the overvoltage detection circuit 150, the trigger voltage can be set comparatively arbitrarily, by connecting the plurality of diodes D14 to D16 having a low breakdown voltage in series. Furthermore, the on-resistance after breakdown will be small when the breakdown voltage of the diodes D14 to D16 is low, thus enabling the size of the diodes D14 to D16 to be reduced.

Also, in the overvoltage detection circuit 150, a device that allows current to flow when a certain constant voltage is applied can be used, apart from a diode. For example, an N-channel MOS transistor QN14 in which the gate is connected to the source may be used, as shown in FIG. 10A, or a P-channel MOS transistor QP14 in which the gate is connected to the source may be used, as shown in FIG. 10B.

Alternatively, the NPN bipolar transistor QC14 and the resistance element R14 shown in FIG. 10C may be used, or the PNP bipolar transistor QA14 and the resistance element R14 shown in FIG. 10D may be used. The trigger voltage of the electrostatic protection circuit can be set, using diodes or transistors connected as described above.

According to the above embodiment, a plurality of circuit blocks are connected in series, thus enabling a high hold voltage to be set. Also, because at least one circuit block includes a thyristor having a small leakage current, and a device having a comparatively large current relative to the applied voltage or such a connection is used in the other circuit blocks, such that the voltage between both ends of the other circuit blocks is smaller than the voltage between the anode and the cathode of the thyristor during normal operation, the ratio of the voltages that are applied to the plurality of circuit blocks during normal operation is decided by the current that flows to the circuit blocks.

It is thereby possible to accurately prevent breakdown of the protected circuit immediately after power on, and to prevent breakdown or deterioration of the protection device during prolonged normal operation, without connecting a resistance element in parallel to the plurality of circuit blocks. As a result, the circuit area (chip size) can be reduced, because a resistance element for voltage division is no longer required, in comparison with the related technology shown in FIG. 9 of JP-A-2014-120547. Also, given that the leakage current of the thyristor is small, overvoltage is not readily applied to the other circuit blocks during normal operation, enabling a wider selection of devices constituting the other circuit blocks.

Eleventh Embodiment

Figures 31, 32A, 32B:
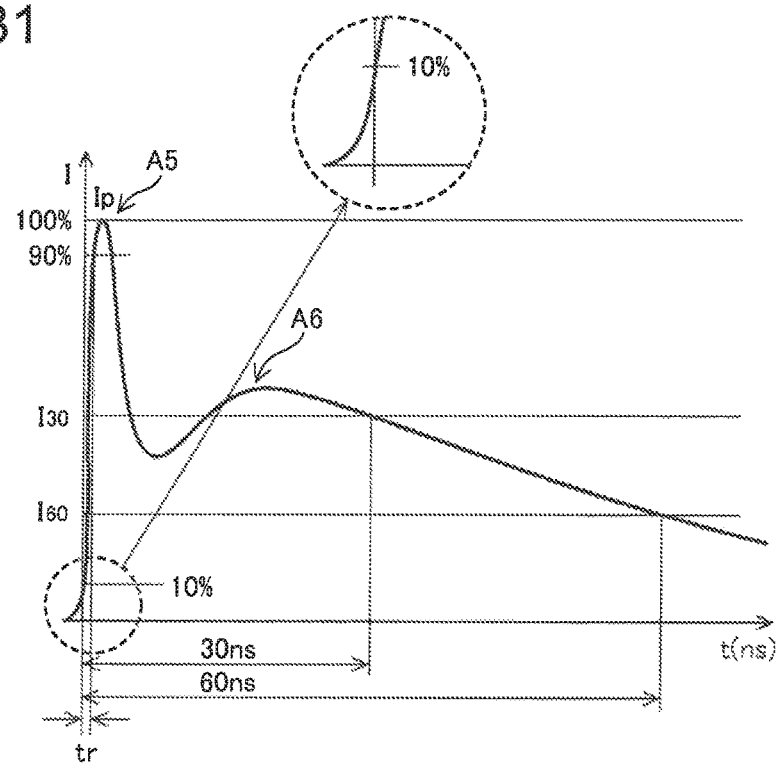
FIG. 31 is a diagram showing a discharge current waveform in a standard for ESD immunity testing.
FIGS. 32A and 32B are diagrams for describing levels of ESD immunity testing.

FIG. 31 is a diagram showing the discharge current waveform in a standard (IEC 61000-4-2) for ESD immunity testing (electrostatic discharge immunity testing). This standard is for electronic devices that are exposed to electrostatic discharge from a charged operator either directly or via a proximal object. A rise time tr of an initial peak shown by A5 in FIG. 31 is extremely short at 0.8 ns±25%. In contrast, with a human body model (HBM) testing method, rise time is approximately 10 ns. With the second peak shown by A6 in FIG. 31, rise is slow in comparison with the initial peak shown by A5, although current is applied over a long period.

FIGS. 32A and 32B are diagrams for describing the level of ESD immunity testing. FIG. 32A shows the range (severity level) of test levels that are recommended for ESD testing in accordance with the standard (IEC 61000-4-2) for ESD immunity testing. FIG. 32B shows the output current waveform definition of an ESD producing device.

In FIG. 32B, Ip represents the initial discharge peak current, tr represents the discharge switch rise time, $I_{30}$ represents the current value at 30 ns, and $I_{60}$ represents the current value at 60 ns. For example, in the case of test level 1, an indicated voltage is 2 kV, the initial discharge peak current is a 7.5 A flow, and the current value at 30 ns is 4 A.

ESD immunity testing is performed in order to verify operational continuity and reliability at realistic ESD levels adapted to actual use situations of an electronic device. For example, a discharge pulse is applied by a discharge gun to power supply terminals or the like of the IC, in a state where a semiconductor integrated circuit device (IC) is mounted on a circuit board (test substrate) and power is supplied to the IC. A large current flows between the power supply terminals of the IC, with this discharge pulse as a factor.

Because the electrostatic protection circuits according to the first to tenth embodiments start the discharge operation when triggered by a voltage that is applied, the reaction to a surge current is fast, and there is a possibility that all of the surge current produced by the ESD immunity testing will flow into the electrostatic protection circuit inside the IC. Accordingly, in order to satisfy test level 1, the electrostatic protection circuit needs to be designed such that breakdown does not occur, even when the flow of current is 7.5 A or more.

Figure 34:
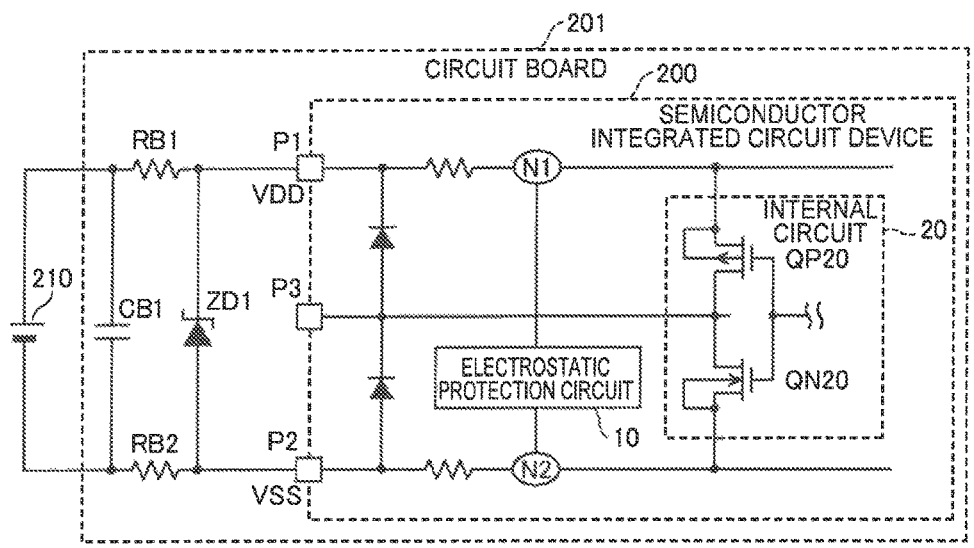
FIG. 34 is a circuit diagram showing an exemplary configuration of an electronic device according to the first embodiment of the invention.

For example, referring to FIG. 34, a power supply voltage is supplied from a power supply circuit 210 of an electronic device to a semiconductor integrated circuit device (IC) 200, during normal operation of the electronic device in which the IC 200 is installed. In the case where a bypass capacitor CB1 is connected between the power supply terminal P1 and the power supply terminal P2, an antinoise measure is effected by the bypass capacitor CB1. This bypass capacitor CB1 is, for example, provided on a circuit board 201 on which the IC 200 is mounted.

When ESD immunity testing is implemented on such an electronic device, the noise component can be removed to a certain degree by the bypass capacitor CB1. However, in the case where the output impedance of the power supply circuit 210 is high, and the resistance values of parasitic resistors RB1 and RB2 of the wiring of the circuit board 201 are low, there is a possibility that almost all of the surge current produced by the ESD immunity testing will flow into the IC 200. An advantage of the eleventh embodiment described below is to solve such a problem.

Figure 33:
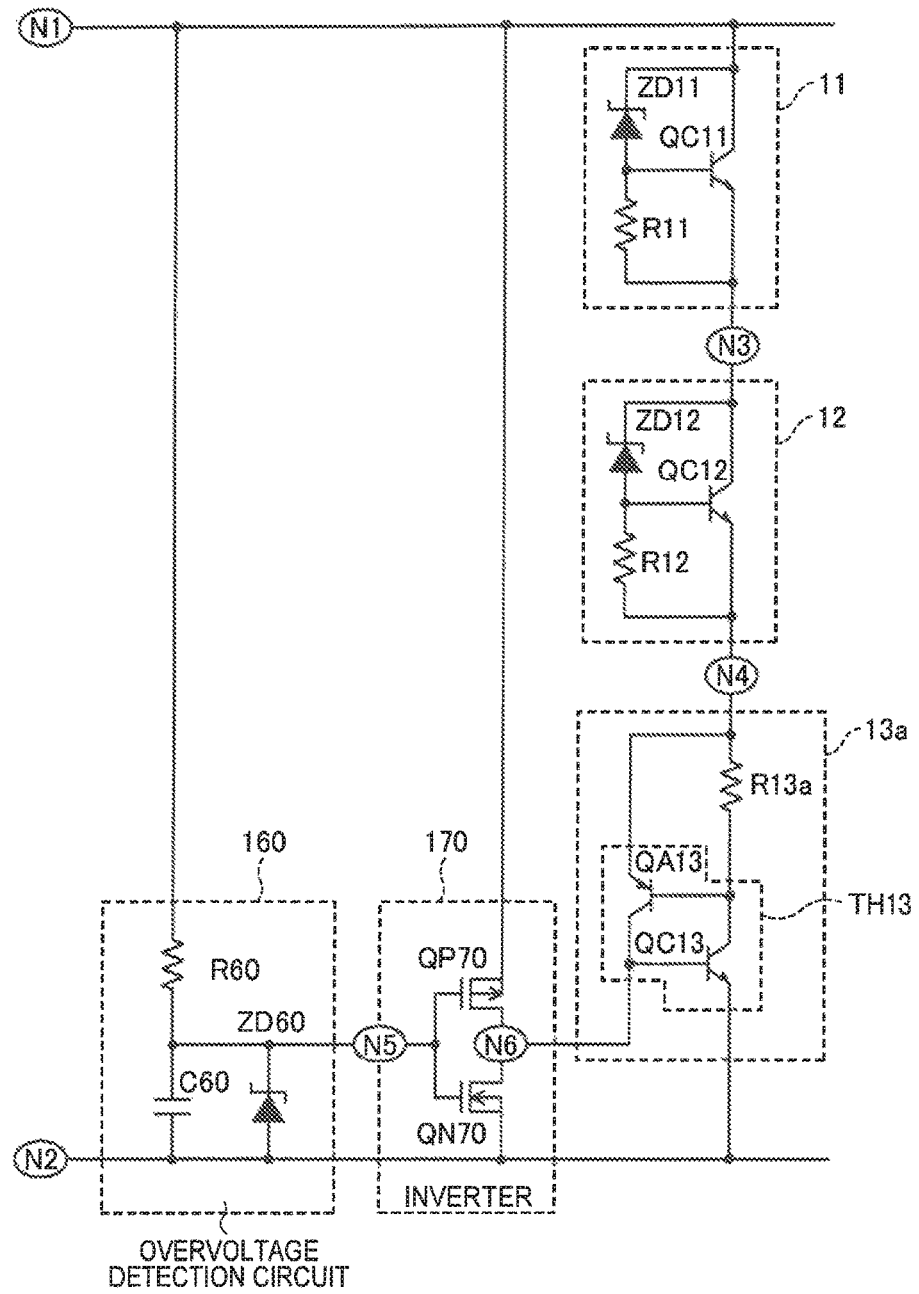
FIG. 33 is a circuit diagram showing an exemplary configuration of an electrostatic protection circuit according to an eleventh embodiment of the invention.

FIG. 33 is a circuit diagram showing an exemplary configuration of an electrostatic protection circuit according to the eleventh embodiment of the invention. In the electrostatic protection circuit according to the eleventh embodiment, an overvoltage detection circuit 160 and an inverter 170 are added to a configuration including a plurality of circuit blocks connected in series between a node N1 and a node N2. In other regards, the eleventh embodiment may be configured similarly to any of the first to the tenth embodiments.

As shown in FIG. 33, the electrostatic protection circuit includes circuit blocks 11, 12 and 13*a* connected in series between the node N1 and the node N2. The configuration shown in FIG. 33 is one example, and the number and connection order of the circuit blocks are arbitrary. The circuit blocks 11, 12 and 13*a* are respectively the same as those described in the sixth embodiment shown in FIG. 23.

Furthermore, the electrostatic protection circuit includes the overvoltage detection circuit 160 and the inverter 170. The overvoltage detection circuit 160, for example, includes a diode or a transistor (in FIG. 33, zener diode ZD60 is shown as one example), a resistance element R60, and a capacitor C60, and functions to detect overvoltage that is applied between the node N1 and the node N2 and generate a detection signal.

The zener diode ZD60 clamps the voltage between an input node N5 of the inverter 170 and the node N2 when the potential of the node N1 becomes higher than the potential of the node N2 and the voltage between the cathode and the anode reaches the breakdown voltage. Accordingly, the zener diode ZD60 is able to set the trigger voltage of the electrostatic protection circuit, similarly to the diode D13 described in any of the first to tenth embodiments. Alternatively, a MOS transistor or a bipolar transistor such as shown in FIGS. 10A to 10D may be used, instead of the zener diode ZD60.

The inverter 170, for example, includes a P-channel MOS transistor QP70 and an N-channel MOS transistor QN70, and corresponds to a delay circuit that at least delays the detection signal that is generated by the overvoltage detection circuit 160 and supplies the delayed detection signal to the gate of the thyristor TH13 of the circuit block 13*a*. The inverter 170 delays the detection signal that is applied to the input node N5, and inverts the level of the detection signal, generates an output signal and outputs the output signal from an output node N6.

The delay time in the inverter 170 is given as 10 ns, for example. The output node N6 of the inverter 170 is connected to the P-gate of the thyristor TH13 of the circuit block 13*a*, and the P-gate of the thyristor TH13 is controlled by the output signal of the inverter 170.

The overvoltage detection circuit 160 activates the detection signal that is applied to the input node N5 of the inverter 170 to a low level when the potential of the node N1 becomes higher than the potential of the node N2 and the voltage between the node N1 and the node N2 reaches a certain constant voltage. Alternatively, the overvoltage detection circuit 160 activates the detection signal that is applied to the input node N5 of the inverter 170 to a low level when the voltage between the node N1 and the node N2 rises steeply due to electrostatic discharge or the like.

The inverter 170 activates the output signal to a high level, after 10 ns has elapsed from when the detection signal was activated to a low level. The thyristor TH13 of the circuit block 13*a* thereby enters an ON state. Although, in FIG. 33, a configuration in which the P-gate of the thyristor TH13 is controlled is shown, a configuration may be adopted that controls the N-gate of the thyristor TH13.

As described above, when the thyristor TH13 is driven via the inverter 170, the thyristor TH13 still maintains an OFF state for a period until 10 ns elapses from when the surge current occurs due to ESD immunity testing. That is, during the period in which the initial discharge peak current Ip shown by A5 in FIG. 31 flows, the electrostatic protection circuit is in an OFF state, and thus the surge current flows into the power supply circuit or the bypass capacitor, and the initial discharge peak current of 7.5 A in test level 1 does not flow into the IC. As a result, the electrostatic protection circuit need only be designed with consideration for a current 4 A of the second peak shown by A6 in FIG. 31.

According to this embodiment, it is possible to prevent all of the surge current produced by ESD immunity testing from flowing into the electrostatic protection circuit, while effectively protecting the internal circuit of the semiconductor integrated circuit device from ESD. As a result, miniaturization of the electrostatic protection circuit becomes possible. Furthermore, according to the first to eleventh embodiments, a semiconductor integrated circuit device having a high breakdown voltage and with which an increase in chip size is suppressed, by incorporating an electrostatic protection circuit that enables a high hold voltage to be set and can be miniaturized, can be provided.

Electronic Device 1

Next, an electronic device according to the embodiments of the invention will be described.

FIG. 34 is a circuit diagram showing an exemplary configuration of an electronic device according to the first embodiment of the invention. This electronic device includes the semiconductor integrated circuit device 200, the zener diode ZD1, the bypass capacitor CB1 and the power supply circuit 210 according to one embodiment of the invention. The zener diode ZD1 and the bypass capacitor CB1 are mounted on the circuit board 201 together with the semiconductor integrated circuit device 200. The parasitic resistors RB1 and RB2 exist in the wiring of the circuit board 201.

The power supply circuit 210 supplies a power supply voltage to the circuit board 201. A power supply potential VDD on the high potential side is thereby supplied to the power supply terminal P1 of the semiconductor integrated circuit device 200, and a power supply potential VSS on the low potential side is supplied to the power supply terminal P2. The zener diode ZD1 is mounted on the circuit board 201 together with the semiconductor integrated circuit device 200, and is arranged in proximity to the power supply terminals P1 and P2 of the semiconductor integrated circuit device 200.

The zener diode ZD1 has a cathode connected to the power supply terminal P and an anode connected to the power supply terminal P2. The zener diode ZD1 allows discharge current to flow when the potential of the power supply terminal P1 becomes higher than the potential of the power supply terminal P2 and the voltage between the cathode and the anode reaches the breakdown voltage.

According to this embodiment, the surge current that is produced by ESD immunity testing flows to the zener diode ZD1, as a result of providing the zener diode ZD1 on the circuit board 201. Accordingly, the current that flows to the electrostatic protection circuit 10 decreases, thus enabling further miniaturization of the electrostatic protection circuit 10.

Electronic Device 2

Figure 35:
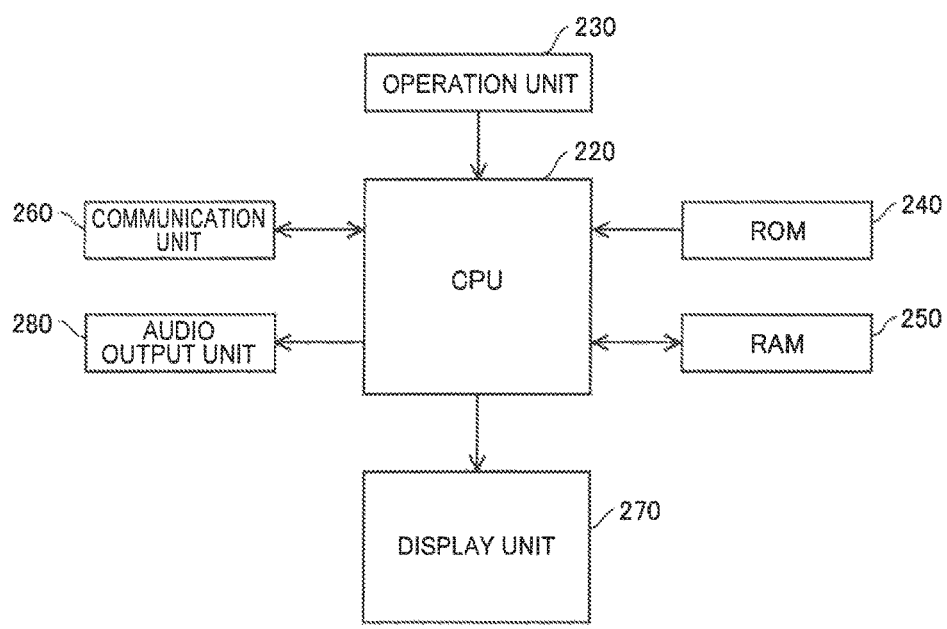
FIG. 35 is a block diagram showing an exemplary configuration of an electronic device according to the second embodiment of the invention.

FIG. 35 is a block diagram showing an exemplary configuration of an electronic device according to the second embodiment of the invention. As shown in FIG. 35, this electronic device may include a CPU 220, an operation unit 230, a ROM (read-only memory) 240, a RAM (random access memory) 250, a communication unit 260, a display unit 270, and an audio output unit 280.

Here, the CPU 220 and at least some of constituent elements from the ROM 240 to the audio output unit 280 are incorporated in the semiconductor integrated circuit device 200 according to one embodiment of the invention. Note that some of the constituent elements shown in FIG. 35 may be omitted or changed, or other constituent elements may be added to the constituent elements shown in FIG. 35.

The CPU 220 performs various types of signal processing and control processing using the data that is supplied from outside and the like, in accordance with programs that are stored in the ROM 240 and the like. For example, the CPU 220 performs various types of signal processing according to operation signals that are supplied from the operation unit 230, controls the communication unit 260 in order to perform data communication with the outside, generates image signals for displaying various types of images on the display unit 270, and generates audio signals for outputting various types of audio from the audio output unit 280.

The operation unit 230, for example, is an input device including operation keys, button switches or the like, and outputs operation signals that depend on operations performed by a user to the CPU 220. The ROM 240 stores programs, data and the like for the CPU 220 to perform various types of signal processing and control processing. Also, the RAM 250 is used as a work area of the CPU 220, and temporarily stores programs and data read out from the ROM 240, data input using the operation unit 230, or the results of operations that the CPU 220 has executed in accordance with the programs.

The communication unit 260, for example, is constituted by analog circuitry and digital circuitry, and performs data communication between the CPU 220 and an external device. The display unit 270, for example, includes an LCD (liquid crystal display) or the like, and displays various types of images based on image signals that are supplied from the CPU 220. Also, the audio output unit 280, for example, includes a speaker or the like, and outputs audio based on audio signals that are supplied from the CPU 220.

The electronic device corresponds, for example, to a clock such as a wrist watch or a table clock, a timer, a mobile phone or similar mobile terminal, a digital still camera, a digital video camera, a television, a TV phone, a security television monitor, a head-mounted display, a personal computer, a printer, a network device, a multifunction peripheral, an on-board device (navigation device, etc.), a calculator, an electronic dictionary, an electronic game machine, a robot, a measurement device, or a medical device (e.g., electronic thermometer, sphygmomanometer, blood glucose meter, electrocardiograph device, ultrasonic diagnostic apparatus, and electronic endoscope). According to the above embodiments, a highly reliable electronic device can be provided at low cost, using a semiconductor integrated circuit device having a high breakdown voltage and with which an increase in chip size is suppressed.

In the invention, any of the above embodiments can also be used in combination. The invention is thus not limited to the embodiments described above, and many modifications can be made within the technical idea of the invention by a person having ordinary skill in the art.

The entire disclosure of Japanese Patent Application No. 2016-031697, filed Feb. 23, 2016 is expressly incorporated by reference herein.

What is claimed is:

1. An electrostatic protection circuit connected to a first terminal via a first node and connected to a second terminal via a second node, comprising:
    an overvoltage detection circuit having at least one diode and having a first end and a second end; and
    a plurality of circuit blocks connected in series between the first node and the second node,
    wherein at least one circuit block out of the plurality of circuit blocks includes a thyristor having an anode connected to one end of the at least one circuit block and a cathode connected to another end of the at least one circuit block,
    the first end of the overvoltage detection circuit is connected to the first node, and the second end of the overvoltage detection circuit is connected to a base of the thyristor that is connected to the another end of the at least one circuit block via a resistor, and when a potential of the first node is higher than a potential of the second node during normal operation, a voltage between both ends of the other circuit blocks out of the plurality of circuit blocks is smaller than a voltage between the anode and the cathode of the thyristor.

2. The electrostatic protection circuit according to claim 1, wherein another at least one circuit block out of the plurality of circuit blocks includes:

a bipolar transistor having a collector connected to one end of the other at least one circuit block and an emitter connected to another end of the other at least one circuit block;

a resistance element connected between the emitter and a base of the bipolar transistor; and a zener diode that is connected between the collector and the base of the bipolar transistor, and that allows current to flow to the resistance element or to the base of the bipolar transistor when the potential of the first node becomes higher than the potential of the second node and the voltage between both ends of the other at least one circuit block reaches a breakdown voltage.

3. The electrostatic protection circuit according to claim 1, wherein another at least one circuit block out of the plurality of circuit blocks includes:

a MOS transistor that has a drain connected to one end of the other at least one circuit block and a source connected to another end of the other at least one circuit block, and that allows discharge current to flow when the potential of the first node becomes higher than the potential of the second node and the voltage between both ends of the other at least one circuit block reaches a predetermined voltage.

4. The electrostatic protection circuit according to claim 1, wherein another at least one circuit block out of the plurality of circuit blocks includes:

a bipolar transistor that has a collector connected to one end of the other at least one circuit block and an emitter connected to another end of the other at least one circuit block, and that allows discharge current to flow when the potential of the first node becomes higher than the potential of the second node and the voltage between both ends of the other at least one circuit block reaches a predetermined voltage.

5. The electrostatic protection circuit according to claim 3, wherein a predetermined region, of the drain or the source of the MOS transistor, including a portion that a contact contacts is silicided, and a remaining region of the drain or the source is not silicided.

6. The electrostatic protection circuit according to claim 4, wherein a predetermined region, of the collector of the bipolar transistor, including a portion that a contact contacts is silicided, and a remaining region of the collector is not silicided.

7. The electrostatic protection circuit according to claim 1, further comprising:

a diode or a transistor that has one end connected to a P-gate of the thyristor and another end connected to an N-gate of the thyristor, and that allows current to flow to the circuit block including the thyristor when the potential of the first node becomes higher than the potential of the second node and the voltage between both ends of the circuit block including the thyristor reaches a breakdown voltage.

8. The electrostatic protection circuit according to claim 1, further comprising:

an overvoltage detection circuit that includes a diode or a transistor, and that detects an overvoltage that is applied between the first node and the second node and generates a detection signal; and a delay circuit that at least delays the detection signal that is generated by the overvoltage detection circuit and supplies the delayed detection signal to a gate of the thyristor.

9. A semiconductor integrated circuit device comprising the electrostatic protection circuit according to claim 1.

10. An electronic device comprising the semiconductor integrated circuit device according to claim 9.

11. The electronic device according to claim 10, further comprising:

a zener diode that is mounted on a circuit board together with the semiconductor integrated circuit device, and that has a cathode connected to the first terminal and an anode connected to the second terminal.

12. The electrostatic protection circuit according to claim 1, wherein the at least one diode has a breakdown voltage lower than that of the thyristor.

13. The electrostatic protection circuit according to claim 1, wherein the at least one diode includes a plurality of diodes connected in series.

* * * * *